United States Patent
Kasahara et al.

(10) Patent No.: US 12,123,799 B2
(45) Date of Patent: Oct. 22, 2024

(54) ELECTRICAL INSPECTION METHOD

(71) Applicant: HAMAMATSU PHOTONICS K.K., Hamamatsu (JP)

(72) Inventors: Takashi Kasahara, Hamamatsu (JP); Katsumi Shibayama, Hamamatsu (JP); Masaki Hirose, Hamamatsu (JP); Toshimitsu Kawai, Hamamatsu (JP); Hiroki Oyama, Hamamatsu (JP); Yumi Kuramoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 442 days.

(21) Appl. No.: 16/765,564

(22) PCT Filed: Nov. 9, 2018

(86) PCT No.: PCT/JP2018/041734
§ 371 (c)(1),
(2) Date: May 20, 2020

(87) PCT Pub. No.: WO2019/102880
PCT Pub. Date: May 31, 2019

(65) Prior Publication Data
US 2020/0309637 A1 Oct. 1, 2020

(30) Foreign Application Priority Data
Nov. 24, 2017 (JP) .................. 2017-226092

(51) Int. Cl.
*G01M 11/00* (2006.01)
*G01J 3/02* (2006.01)
(Continued)

(52) U.S. Cl.
CPC .......... *G01M 11/00* (2013.01); *G01J 3/0243* (2013.01); *G01J 3/26* (2013.01); *G01R 1/0675* (2013.01);
(Continued)

(58) Field of Classification Search
CPC .......... G02B 5/28; G02B 5/284; G02B 5/285; G02B 5/20; G02B 26/00; G02B 26/001;
(Continued)

(56) References Cited

U.S. PATENT DOCUMENTS

2006/0215147 A1 9/2006 Scott et al.
2007/0046950 A1 3/2007 Brown et al.
(Continued)

FOREIGN PATENT DOCUMENTS

| CN | 103675977 A | 3/2014 |
| CN | 105992964 A | 10/2016 |

(Continued)

OTHER PUBLICATIONS

International Preliminary Report on Patentability mailed Jun. 4, 2020 for PCT/JP2018/041734.

*Primary Examiner* — Jie Lei
(74) *Attorney, Agent, or Firm* — Faegre Drinker Biddle & Reath LLP

(57) ABSTRACT

An electrical inspection method includes: a step of preparing a wafer in which a plurality of Fabry-Perot interference filter portions is formed, each of the plurality of Fabry-Perot interference filter portions in which a distance between a first mirror portion and a second mirror portion facing each other varies by an electrostatic force; and a step of inspecting electrical characteristics of each of the plurality of Fabry-Perot interference filter portions.

4 Claims, 19 Drawing Sheets

(51) Int. Cl.
  *G01J 3/26*  (2006.01)
  *G01R 1/067*  (2006.01)
  *G01R 27/26*  (2006.01)
  *G01R 31/52*  (2020.01)
  *G02B 5/28*  (2006.01)
  *G02B 26/00*  (2006.01)

(52) U.S. Cl.
  CPC ......... *G01R 27/2605* (2013.01); *G01R 31/52* (2020.01); *G02B 5/28* (2013.01); *G02B 26/001* (2013.01)

(58) Field of Classification Search
  CPC ...... G02B 26/0841; G01J 3/00; G01J 3/0243; G01J 3/26; G01J 3/28; G01J 3/12; G01R 1/06; G01R 1/0675; G01R 1/067; G01R 31/28; G01R 31/52; G01R 27/2605; G01R 27/26; G01M 11/00; H01L 27/1446
  USPC .... 359/337.22, 370, 223.1, 224.1, 260, 290, 359/291, 489.19, 577, 578, 584; 324/658, 324/661
  See application file for complete search history.

(56) References Cited

U.S. PATENT DOCUMENTS

| | | |
|---|---|---|
| 2011/0086443 A1 | 4/2011 | Kobayashi et al. |
| 2014/0092478 A1 | 4/2014 | Shinto |

FOREIGN PATENT DOCUMENTS

| | | |
|---|---|---|
| EP | 3037854 A1 | 6/2016 |
| EP | 3106910 A1 | 12/2016 |
| JP | H02-234104 A | 9/1990 |
| JP | H9-331225 A | 12/1997 |
| JP | 2002-033604 A | 1/2002 |
| JP | 2002-174721 A | 6/2002 |
| JP | 2008-058647 A | 3/2008 |
| JP | 2008-516267 A | 5/2008 |
| JP | 2008-261692 A | 10/2008 |
| JP | 2011-008225 A | 1/2011 |
| JP | 2013-506154 A | 2/2013 |
| JP | 2015-152713 A | 8/2015 |
| JP | 2016-125820 A | 7/2016 |
| JP | 2017-072757 A | 4/2017 |
| TW | 200712551 A | 4/2007 |
| WO | WO-2006/036601 A2 | 4/2006 |
| WO | WO-2009/154091 A1 | 12/2009 |
| WO | WO-2011/036346 A1 | 3/2011 |

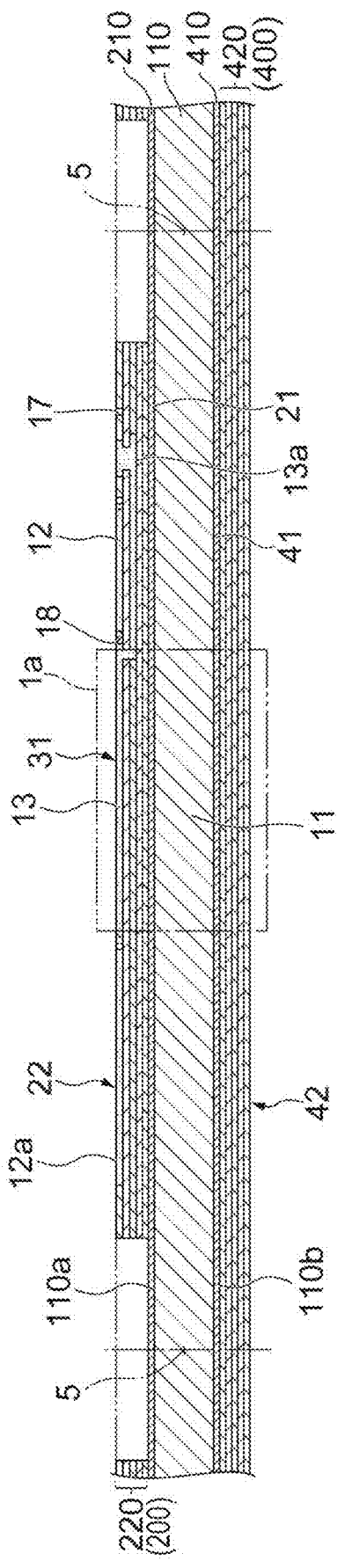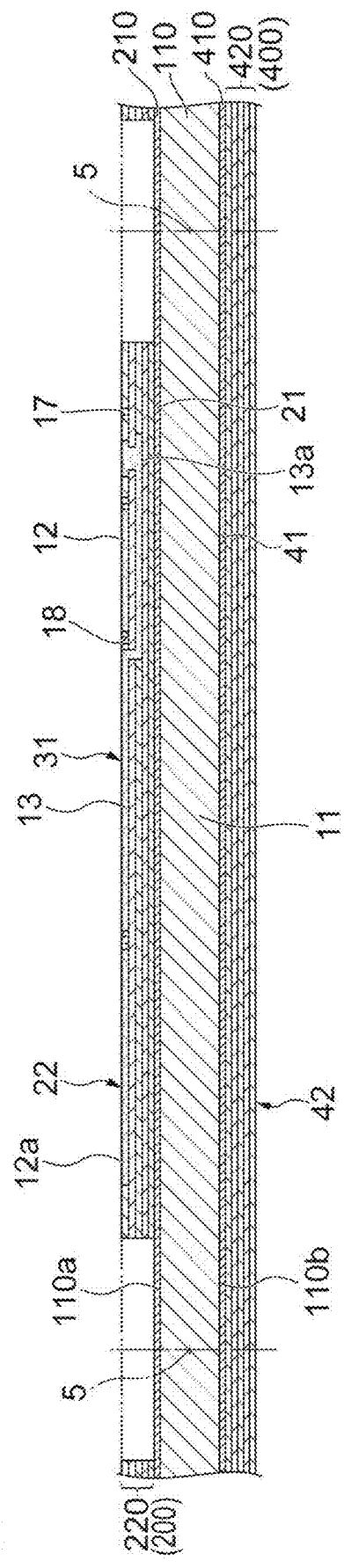
Fig.8

ELECTRICAL INSPECTION METHOD

TECHNICAL FIELD

The present disclosure relates to an electrical inspection method for obtaining a Fabry-Perot interference filter.

BACKGROUND ART

In the related art, a Fabry-Perot interference filter including a substrate, a fixed mirror and a movable mirror facing each other via a gap on the substrate is known (for example, refer to Patent Literature 1).

CITATION LIST

Patent Literature

Patent Literature 1: Japanese Unexamined Patent Publication No. 2013-506154

SUMMARY OF INVENTION

Technical Problem

Since a Fabry-Perot interference filter as described above is a fine structure, it is difficult to improve both manufacturing efficiency and a yield when a Fabry-Perot interference filter is manufactured.

Therefore, the present disclosure aims to provide an electrical inspection method capable of obtaining a plurality of Fabry-Perot interference filters with high efficiency and high yield.

Solution to Problem

An electrical inspection method according to one aspect of the present disclosure includes: a step of preparing a wafer including a substrate layer, and a plurality of pairs two-dimensionally arranged on the substrate layer, each of the plurality of pairs having a first mirror portion and a second mirror portion, a plurality of Fabry-Perot interference filter portions being formed in the wafer, each of the plurality of Fabry-Perot interference filter portions in which a gap is formed between the first mirror portion and the second mirror portion facing each other and a distance between the first mirror portion and the second mirror portion facing each other varies by an electrostatic force; and a step of inspecting electrical characteristics of each of the plurality of Fabry-Perot interference filter portions.

This electrical inspection method inspects electrical characteristics of a plurality of Fabry-Perot interference filter portions to be a plurality of Fabry-Perot interference filters, in a state of a wafer. This enables the electrical inspection method to obtain a plurality of Fabry-Perot interference filters with high efficiency and with high yield. The reason is as follows. The Fabry-Perot interference filter is an element in which characteristics are likely to change during individual processes from being cut out from a wafer to being assembled onto a light detection device, for example. Therefore, inspection of the characteristics of the Fabry-Perot interference filter is considered to be necessary during the final assembly. On the other hand, the present inventors have found that the Fabry-Perot interference filter portion once being a non-faulty product in the state of wafer is unlikely to be a faulty Fabry-Perot interference filter even with a subsequent change in characteristics. Therefore, by inspecting the electrical characteristics of each of Fabry-Perot interference filter portions in the state of wafer, it is possible to increase the probability of bringing a non-faulty Fabry-Perot interference filter to the final assembly stage while eliminating the waste that the Fabry-Perot interference filter that is faulty in the state of wafer is brought to the final assembly stage.

In addition, this electrical inspection method enables inspection of the electrical characteristics of each of Fabry-Perot interference filter portions with high efficiency and high accuracy. The reason is as follows. For example, in order to inspect the electrical characteristics of each of Fabry-Perot interference filters, it would be necessary to adjust a support angle for each of the Fabry-Perot interference filters to reliably bring a pair of probe needles into contact with a pair of terminals of the Fabry-Perot interference filter. By inspecting the electrical characteristics of each of Fabry-Perot interference filter portions in the state of wafer, the burden of such adjustment can be reduced. Furthermore, the electrical characteristics in the Fabry-Perot interference filter changes depending on environmental conditions such as temperature. Therefore, when the electrical characteristics are inspected for each of the Fabry-Perot interference filters, the environmental conditions being the basis of inspection results are likely to vary between the individual Fabry-Perot interference filters. By inspecting the electrical characteristics of each of Fabry-Perot interference filter portions in the state of wafer, inspection results can be obtained under stable environmental conditions.

In the step of inspecting the electrical characteristics in the electrical inspection method according to one aspect of the present disclosure, the capacitance may be measured between a pair of terminals provided in each of the plurality of Fabry-Perot interference filter portions to generate an electrostatic force. This makes it possible to inspect the presence or absence of breakage in the second mirror portion, the presence or absence of disconnection in wiring provided in each of the Fabry-Perot interference filter portions, or the like, for each of the Fabry-Perot interference filter portions.

In the step of inspecting the electrical characteristics in the electrical inspection method according to one aspect of the present disclosure, the leakage current may be measured by applying voltage between a pair of terminals provided in each of the plurality of Fabry-Perot interference filter portions to generate an electrostatic force. This makes it possible to inspect, for each of the Fabry-Perot interference filter portions, the presence or absence of a foreign substance in a gap formed between the first mirror portion and the second mirror portion facing each other, the presence or absence of disconnection in the wiring provided in each of the Fabry-Perot interference filter portions, or the like.

The electrical inspection method according to one aspect of the present disclosure may further include a step of imaging a wafer. This makes it possible to acquire coordinate information of each of the Fabry-Perot interference filter portions and possible to bring a pair of probe needles into contact with a pair of terminals of the Fabry-Perot interference filter portions on the basis of the acquired coordinate information.

Advantageous Effects of Invention

According to the present disclosure, it is possible to provide an electrical inspection method capable of obtaining a plurality of Fabry-Perot interference filters with high efficiency and high yield.

BRIEF DESCRIPTION OF DRAWINGS

FIG. 8 is a cross-sectional view illustrating a method for manufacturing the wafer illustrated in FIG. 5.

DESCRIPTION OF EMBODIMENTS

Figure 1:
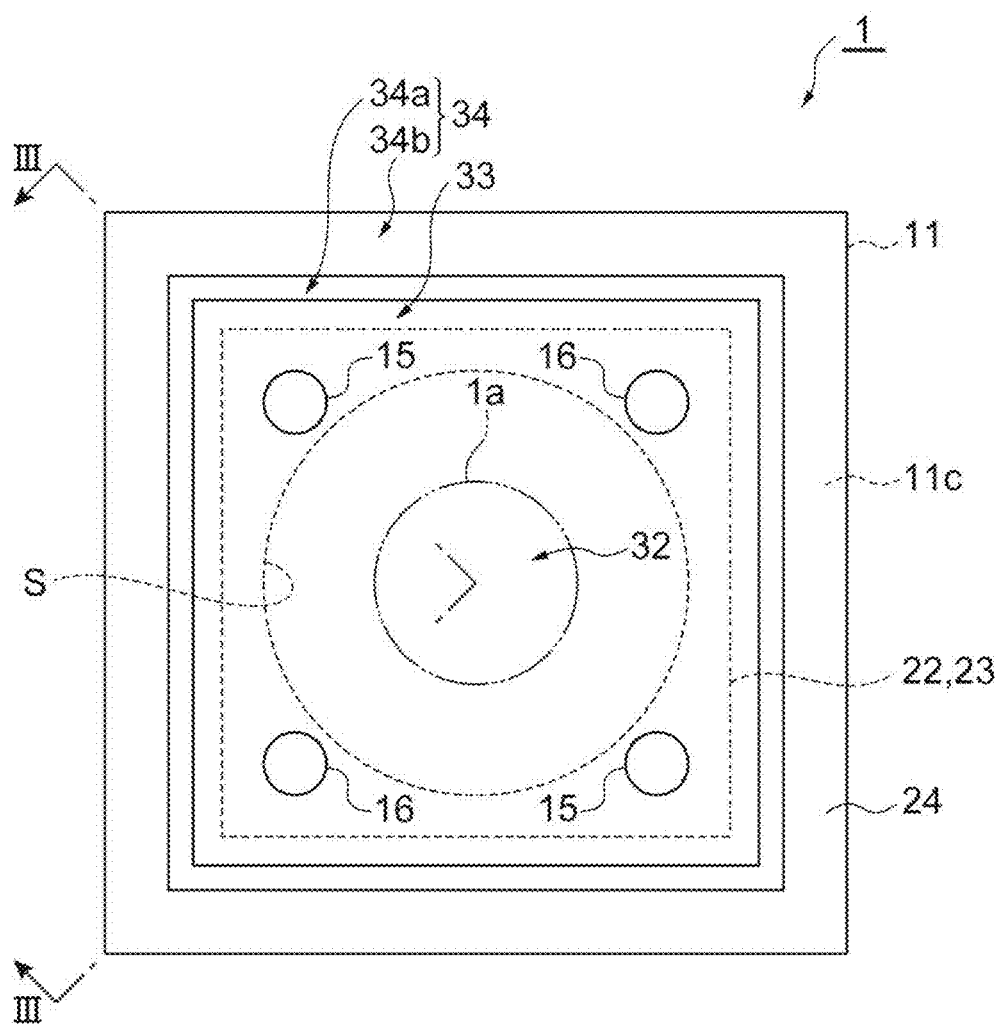
FIG. 1 is a plan view of a Fabry-Perot interference filter cut out from a wafer as an inspection target of an electrical inspection method according to an embodiment.

Hereinafter, an embodiment of the present disclosure will be described in detail with reference to the drawings. In all the drawings, the same or equivalent portions are denoted with the same reference numerals and duplicated description is omitted.

[Configuration of Fabry-Perot Interference Filter and Dummy Filter]

Prior to the description of an electrical inspection method according to an embodiment, configurations of a Fabry-Perot interference filter and a dummy filter cut out from a wafer as an inspection target will be described.

Figure 2:
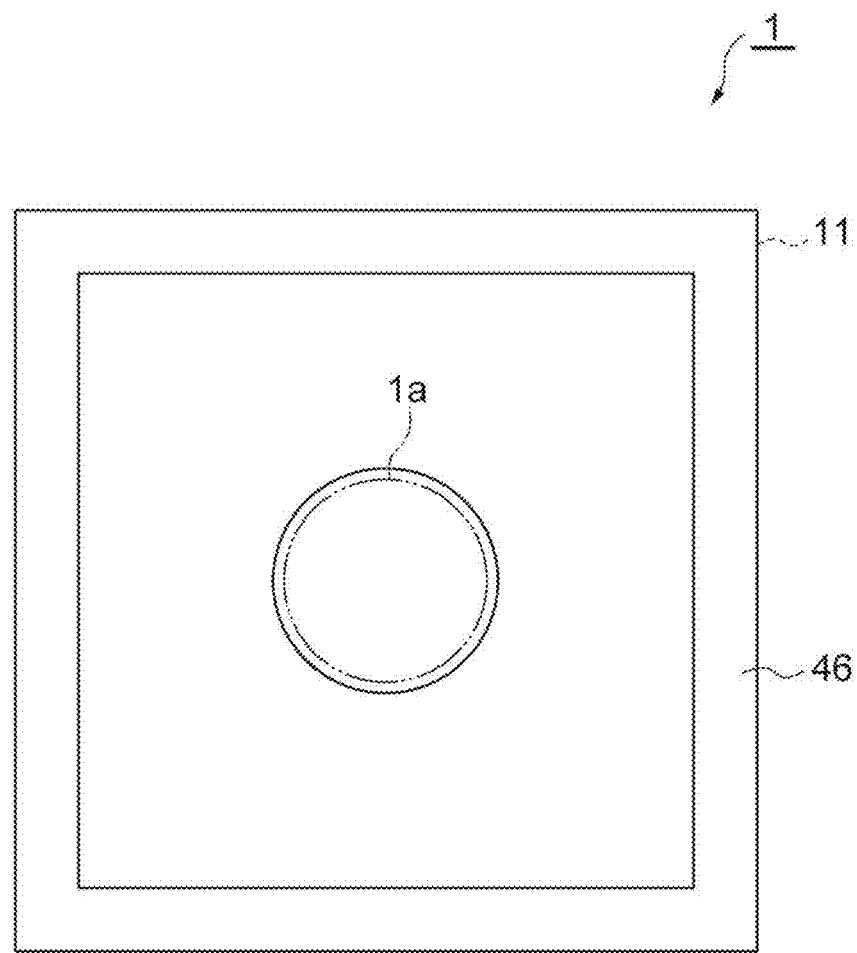
FIG. 2 is a bottom view of the Fabry-Perot interference filter illustrated in FIG. 1.
Figure 3:
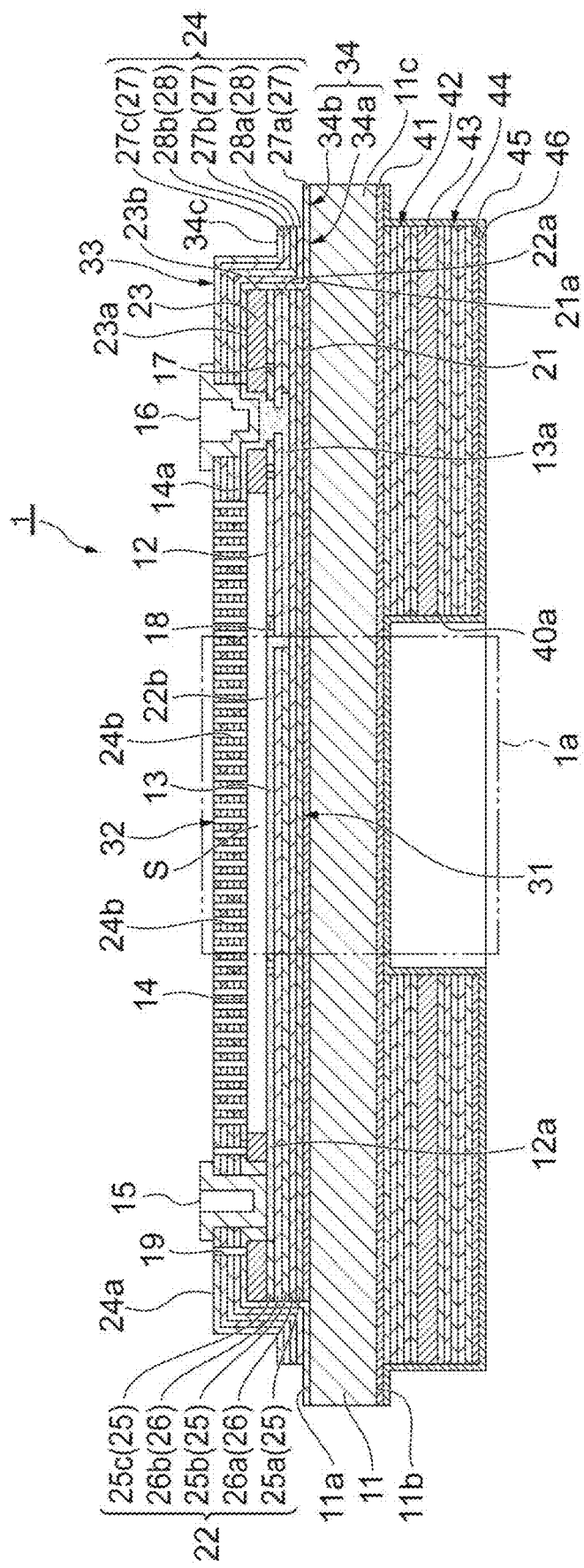
FIG. 3 is a cross-sectional view of the Fabry-Perot interference filter taken along line Ill-Ill in FIG. 1.

As illustrated in FIGS. 1, 2, and 3, a Fabry-Perot interference filter 1 includes a substrate 11. The substrate 11 has a first surface 11a and a second surface 11b opposite to the first surface 11a. On the first surface 11a, a reflection prevention layer 21, a first laminate 22, an intermediate layer 23, and a second laminate 24 are laminated in this order. A gap (air gap) S is defined between the first laminate 22 and the second laminate 24 by the frame-shaped intermediate layer 23.

The shape and the positional relationship of each portion in a case of being seen in a direction perpendicular to the first surface 11a (plan view) are as follows. For example, an outer edge of the substrate 11 has a rectangular shape. The outer edge of the substrate 11 and an outer edge of the second laminate 24 are aligned with each other. An outer edge of the reflection prevention layer 21, an outer edge of the first laminate 22, and an outer edge of the intermediate layer 23 are aligned with each other. The substrate 11 has an outer edge portion 11c positioned on an outer side of the outer edge of the intermediate layer 23 with respect to the center of the gap S. For example, the outer edge portion 11c has a frame shape and surrounds the intermediate layer 23 when viewed in a direction perpendicular to the first surface 11a. The gap S has a circular shape, for example.

The Fabry-Perot interference filter 1 transmits light having a predetermined wavelength through a light transmission region 1a defined in a center portion of the filter 1. For example, the light transmission region 1a is a columnar region. The substrate 11 is formed of silicon, quartz, or glass, for example. When the substrate 11 is formed of silicon, the reflection prevention layer 21 and the intermediate layer 23 are formed of silicon oxide, for example. The thickness of the intermediate layer 23 ranges from several tens of nm to several tens of μm, for example.

A portion corresponding to the light transmission region 1a in the first laminate 22 functions as a first mirror portion 31. The first mirror portion 31 is a fixed mirror. The first mirror portion 31 is disposed on the first surface 11a via the reflection prevention layer 21. The first laminate 22 includes alternate laminations of each of a plurality of polysilicon layers 25 and each of a plurality of silicon nitride layers 26. The Fabry-Perot interference filter 1 includes layers of a polysilicon layer 25a, a silicon nitride layer 26a, a polysilicon layer 25b, a silicon nitride layer 26b, and a polysilicon layer 25c laminated on the reflection prevention layer 21 in this order. The optical thickness of each of the polysilicon layers 25 and the silicon nitride layers 26 included in the first mirror portion 31 is preferably an integral multiple of ¼ of a center transmission wavelength. The first mirror portion 31 may be directly disposed on the first surface 11a without interposing the reflection prevention layer 21.

The portion corresponding to the light transmission region 1a in the second laminate 24 functions as a second mirror portion 32. The second mirror portion 32 is a movable mirror. The second mirror portion 32 faces the first mirror portion 31 via the gap S on a side opposite to the substrate 11 with respect to the first mirror portion 31. The direction in which the first mirror portion 31 and the second mirror portion 32 face each other is parallel to a direction perpendicular to the first surface 11a. The second laminate 24 is disposed on the first surface 11a via the reflection prevention layer 21, the first laminate 22, and the intermediate layer 23. The second laminate 24 includes alternate laminations of each of the plurality of polysilicon layers 27 and each of the plurality of silicon nitride layers 28. The Fabry-Perot interference filter 1 includes layers of a polysilicon layer 27a, a silicon nitride layer 28a, a polysilicon layer 27b, a silicon nitride layer 28b, and a polysilicon layer 27c laminated on the intermediate layer 23 in this order. The optical thickness of each of the polysilicon layer 27 and the silicon nitride layer 28 included in the second mirror portion 32 is preferably an integral multiple of ¼ of the center transmission wavelength.

In the first laminate 22 and the second laminate 24, silicon oxide layers may be used in place of the silicon nitride layers. In addition, examples of the material applicable for each of layers forming the first laminate 22 and the second laminate 24 include titanium oxide, tantalum oxide, zirconium oxide, magnesium fluoride, aluminum oxide, calcium fluoride, silicon, germanium, zinc sulfide, or the like. Here, the surface of the first mirror portion 31 on the gap S side (surface of the polysilicon layer 25c) and the surface of the second mirror portion 32 on the gap S side (surface of the polysilicon layer 27a) directly face each other via the gap S. Note that an electrode layer, a protective layer, or the like (not forming a mirror) may be formed on the surface of the first mirror portion 31 on the gap S side and on the surface of the second mirror portion 32 on the gap S side. In this case, the first mirror portion 31 and the second mirror portion 32 face each other via the gap S with the presence of these interposed layers. In other words, even in such a case, a facing configuration between the first mirror portion 31 and the second mirror portion 32 via the gap S can be achieved.

A plurality of through-holes 24b is formed at a portion of the second laminate 24 corresponding to the gap S (a portion overlapping the gap S when viewed in a direction perpendicular to the first surface 11a). Each of the through-holes 24b extends to reach the gap S from a surface 24a of the second laminate 24 opposite to the intermediate layer 23. The plurality of through-holes 24b is formed so as not to substantially influence the function of the second mirror portion 32. The plurality of through-holes 24b is used for forming the gap S by removing a portion of the intermediate layer 23 through etching.

In addition to the second mirror portion 32, the second laminate 24 further includes a covering portion 33 and a peripheral edge portion 34. The second mirror portion 32, the covering portion 33, and the peripheral edge portion 34 are integrally formed to have a portion of a same laminated structure and to be continuous to each other. The covering portion 33 surrounds the second mirror portion 32 when viewed in a direction perpendicular to the first surface 11a. The covering portion 33 covers a surface 23a of the intermediate layer 23 on a side opposite to the substrate 11, a side surface 23b of the intermediate layer 23 (a side surface on the outer side, that is, a side surface on a side opposite to the gap S side), a side surface 22a of the first laminate 22, and a side surface 21a of the reflection prevention layer 21, so as to reach the first surface 11a. That is, the covering portion 33 covers the outer edge of the intermediate layer 23, the outer edge of the first laminate 22, and the outer edge of the reflection prevention layer 21.

The peripheral edge portion 34 surrounds the covering portion 33 when viewed in a direction perpendicular to the first surface 11a. The peripheral edge portion 34 is positioned on the first surface 11a in the outer edge portion 11c. The outer edge of the peripheral edge portion 34 is aligned with the outer edge of the substrate 11 when viewed in a direction perpendicular to the first surface 11a. The peripheral edge portion 34 is thinned along an outer edge of the outer edge portion 11c. That is, the portion along the outer edge of the outer edge portion 11c in the peripheral edge portion 34 is thinner compared to other portions excluding the portion along the outer edge of the peripheral edge portion 34. In the Fabry-Perot interference filter 1, the peripheral edge portion 34 is thinned by removing a portion of the polysilicon layer 27 and the silicon nitride layer 28 included in the second laminate 24. The peripheral edge portion 34 includes a non-thinned portion 34a continuous to the covering portion 33, and a thinned portion 34b surrounding the non-thinned portion 34a. In the thinned portion 34b, the polysilicon layer 27 and the silicon nitride layer 28 are removed excluding the polysilicon layer 27a directly provided on the first, surface 11a.

The height from the first surface 11a to a surface 34c of the non-thinned portion 34a on a side opposite to the substrate 11 is lower than the height from the first surface 11a to the surface 23a of the intermediate layer 23. The height from the first surface 11a to the surface 34c of the non-thinned portion 34a ranges from 100 nm to 5000 nm, for example. The height from the first surface 11a to the surface 23a of the intermediate layer 23 ranges from 500 nm to 20000 nm, for example. The width of the thinned portion 34b (distance between the outer edge of the non-thinned portion 34a and the outer edge of the outer edge portion 11c when viewed in the direction perpendicular to the first surface 11a) is 0.01 times the thickness of the substrate 11, or more. The width of the thinned portion 34b ranges from 5 μm to 400 μm, for example. The thickness of the substrate 11 ranges from 500 μm to 800 μm, for example.

A first electrode 12 is formed in the first mirror portion 31 so as to surround the light transmission region 1a when viewed in a direction perpendicular to the first surface 11a. The first electrode 12 is formed by doping impurities into the polysilicon layer 25c to achieve low resistivity. A second electrode 13 is formed in the first mirror portion 31 so as to include the light transmission region 1a when viewed in a direction perpendicular to the first surface 11a. The second electrode 13 is formed by doping impurities into the polysilicon layer 25c to achieve low resistivity. Note that although it is preferable that the second electrode 13 is sized to include the entire light transmission region 1a when viewed in a direction perpendicular to the first surface 11a, the second electrode 13 may have substantially the same size as that of the light transmission region 1a.

A third electrode 14 is formed in the second mirror portion 32. The third electrode 14 faces the first electrode 12 and the second electrode 13 via the gap S. The third electrode 14 is formed by doping impurities into the polysilicon layer 27a to achieve low resistivity.

A pair of terminals 15 are provided to face each other across the light transmission region 1a. Each of the terminals 15 is disposed inside a through-hole from the surface 24a of the second laminate 24 to the first laminate 22. Each of the terminals 15 is electrically connected to the first electrode 12 through wiring 12a. For example, each of the terminals 15 is formed with a metal film of aluminum, an alloy thereof, or the like.

A pair of terminals 16 are provided to face each other across the light transmission region 1a. Each of the terminals 16 is disposed inside a through-hole from the surface 24a of the second laminate 24 to the first laminate 22. Each of the terminals 16 is electrically connected to the second electrode 13 through wiring 13a and is electrically connected to the third electrode 14 through wiring 14a. For example, the terminals 16 are formed with a metal film of aluminum, an alloy thereof, or the like. The facing direction of the pair of terminals 15 and the facing direction of the pair of terminals 16 are orthogonal to each other (refer to FIG. 1).

A plurality of trenches 17 and 18 is provided on a surface 22b of the first laminate 22. The trench 17 annularly extends to surround a connection with respect to the terminals 16 in the wiring 13a. The trench 17 electrically insulates the first electrode 12 and the wiring 13a from each other. The trench 18 annularly extends along an inner edge of the first electrode 12. The trench 18 electrically insulates the first electrode 12 and a region of the first electrode 12 on an inner side (second electrode 13) from each other. Each of the regions within the trenches 17 and 18 may be an insulating material or a gap.

A trench 19 is provided on the surface 24a of the second laminate 24. The trench 19 annularly extends to surround the terminals 15. The trench 19 electrically insulates the terminals 15 and the third electrode 14 from each other. The region inside the trench 19 may be an insulating material or a gap.

The second surface 11b of the substrate 11 includes layers of a reflection prevention layer 41, a third laminate 42, an intermediate layer 43, and a fourth laminate 44 laminated in this order. The reflection prevention layer 41 and the intermediate layer 43 each have a configuration similar to those of the reflection prevention layer 21 and the intermediate layer 23. The third laminate 42 and the fourth laminate 44 each have a laminated structure symmetrical to those of the first laminate 22 and the second laminate 24 with respect to the substrate 11. The reflection prevention layer 41, the third laminate 42, the intermediate layer 43, and the fourth laminate 44 have a function of suppressing warpage of the substrate 11.

The third laminate 42, the intermediate layer 43, and the fourth laminate 44 are thinned along the outer edge of the outer edge portion 11c. That is, the portion along the outer edge of the outer edge portion 11c in the third laminate 42, the intermediate layer 43, and the fourth laminate 44 is thinner compared to other portions excluding the portion along the outer edge in the third laminate 42, the intermediate layer 43, and the fourth laminate 44. In the Fabry-Perot interference filter 1, the third laminate 42, the intermediate layer 43, and the fourth laminate 44 are thinned by removing all of the third laminate 42, the intermediate layer 43, and the fourth laminate 44 in a portion overlapping the thinned portion 34b when viewed in a direction perpendicular to the first surface 11a.

The third laminate 42, the intermediate layer 43, and the fourth laminate 44 have an opening 40a so as to include the light transmission region 1a when viewed in a direction perpendicular to the first surface 11a. The opening 40a has a diameter approximately the same as the size of the light transmission region 1a. The opening 40a is open on the light emission side. The bottom surface of the opening 40a reaches the reflection prevention layer 41.

A light shielding layer 45 is formed on a surface of the fourth laminate 44 on the light emission side. For example, the light shielding layer 45 is formed of aluminum or the like. A protective layer 46 is formed on a surface of the light shielding layer 45 and an inner surface of the opening 40a. The protective layer 46 covers the outer edges of the third laminate 42, the intermediate layer 43, the fourth laminate 44, and the light shielding layer 45 and covers the reflection prevention layer 41 on the outer edge portion 11c. For example, the protective layer 46 is formed of aluminum oxide. An optical influence due to the protective layer 46 can be disregarded by forming the protective layer 46 in the thickness ranging from 1 nm to 100 nm (preferably, approximately 30 nm).

In the Fabry-Perot interference filter 1 configured as described above, when a voltage is applied between the first electrode 12 and the third electrode 14 via the pair of terminals 15 and 16, an electrostatic force corresponding to the voltage is generated between the first electrode 12 and the third electrode 14. The second mirror portion 32 is attracted to the first mirror portion 31 side secured to the substrate 11 by the electrostatic force, and the distance between the first mirror portion 31 and the second mirror portion 32 is adjusted. In this manner, in the Fabry-Perot interference filter 1, the distance between the first mirror portion 31 and the second mirror portion 32 changes by the electrostatic force.

The wavelength of light to be transmitted through the Fabry-Perot interference filter 1 depends on the distance between the first mirror portion 31 and the second mirror portion 32 in the light transmission region 1a. Therefore, the wavelength of light to be transmitted through the Fabry-Perot interference filter 1 can be appropriately selected by adjusting the voltage to be applied between the first electrode 12 and the third electrode 14. At this time, the second electrode 13 has the same potential as that of the third electrode 14. Therefore, the second electrode 13 functions as a compensation electrode to keep the first mirror portion 31 and the second mirror portion 32 flat in the light transmission region 1a.

In the Fabry-Perot interference filter 1, for example, a spectroscopic spectrum can be obtained by detecting light transmitted through the light transmission region 1a of the Fabry-Perot interference filter 1 using a light detector while changing the voltage to be applied to the Fabry-Perot interference filter 1 (that is, while changing the distance between the first mirror portion 31 and the second mirror portion 32 in the Fabry-Perot interference filter 1).

Figure 4:
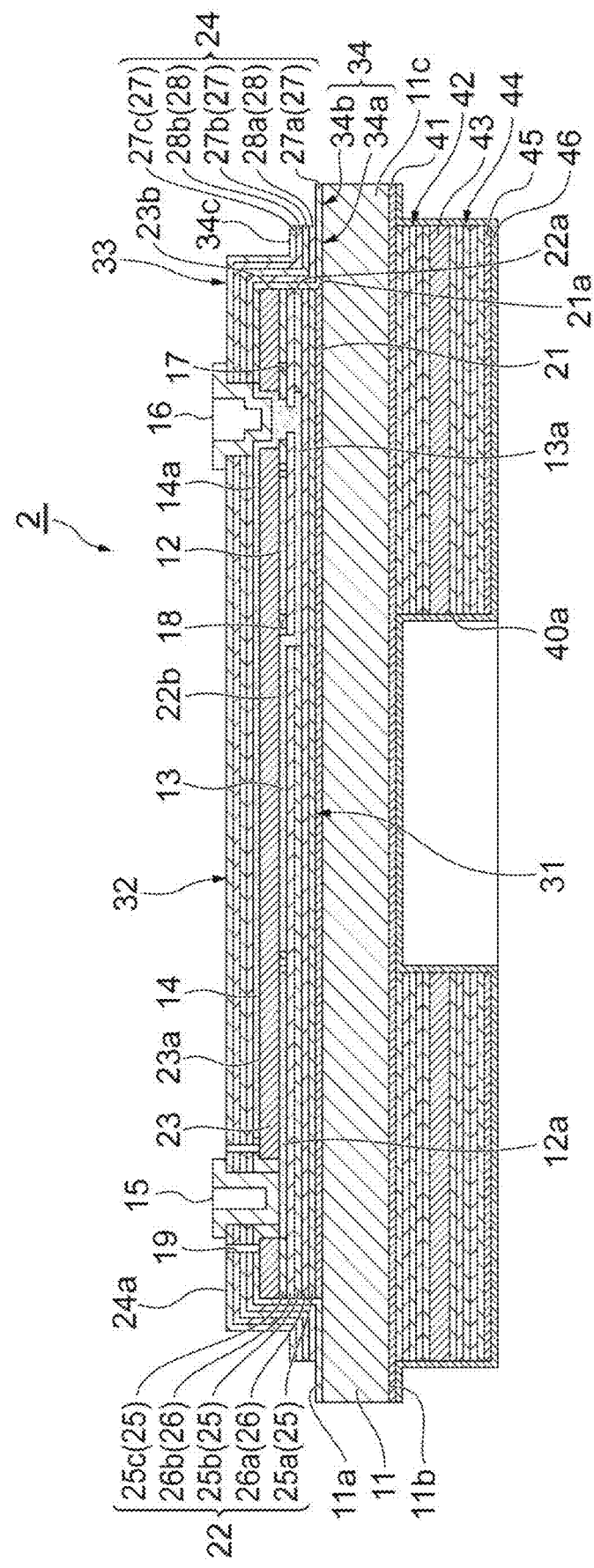
FIG. 4 is a cross-sectional view of a dummy filter cut out from a wafer as an inspection target of an electrical inspection method according to an embodiment.

As illustrated in FIG. 4, the dummy filter 2 is different from the Fabry-Perot interference filter 1 described above in that the plurality of through-holes 24b is not formed in the second laminate 24 and the gap S is not formed in the intermediate layer 23. In the dummy filter 2, an intermediate layer 23 is provided between the first mirror portion 31 and the second mirror portion 32. That is, the second mirror portion 32 is disposed on the surface 23a of the intermediate layer 23, not floating above the gap S.

[Wafer Configuration]

Figure 5:
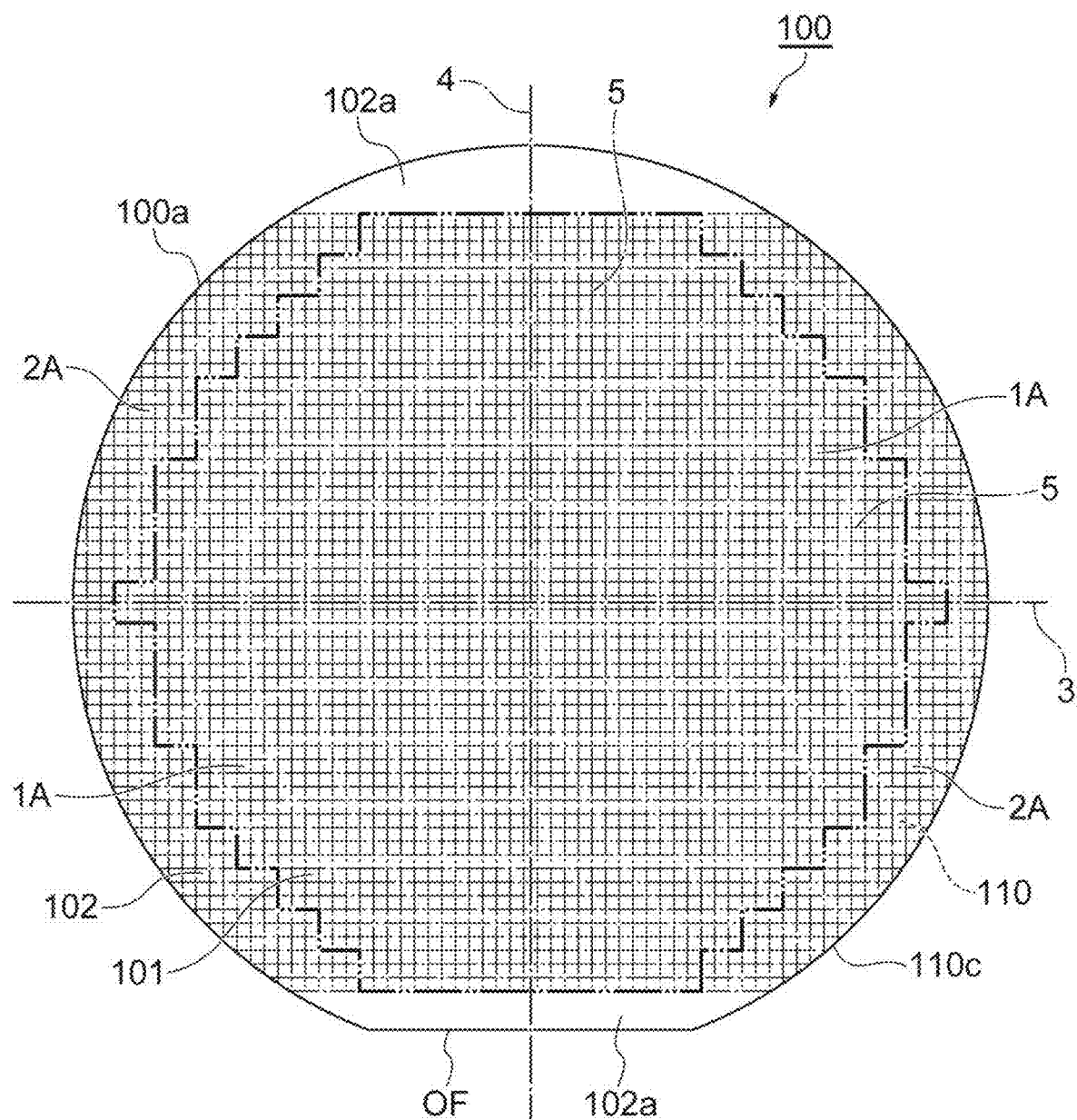
FIG. 5 is a plan view of a wafer as an inspection target of electrical inspection method according to an embodiment.
Figure 6:
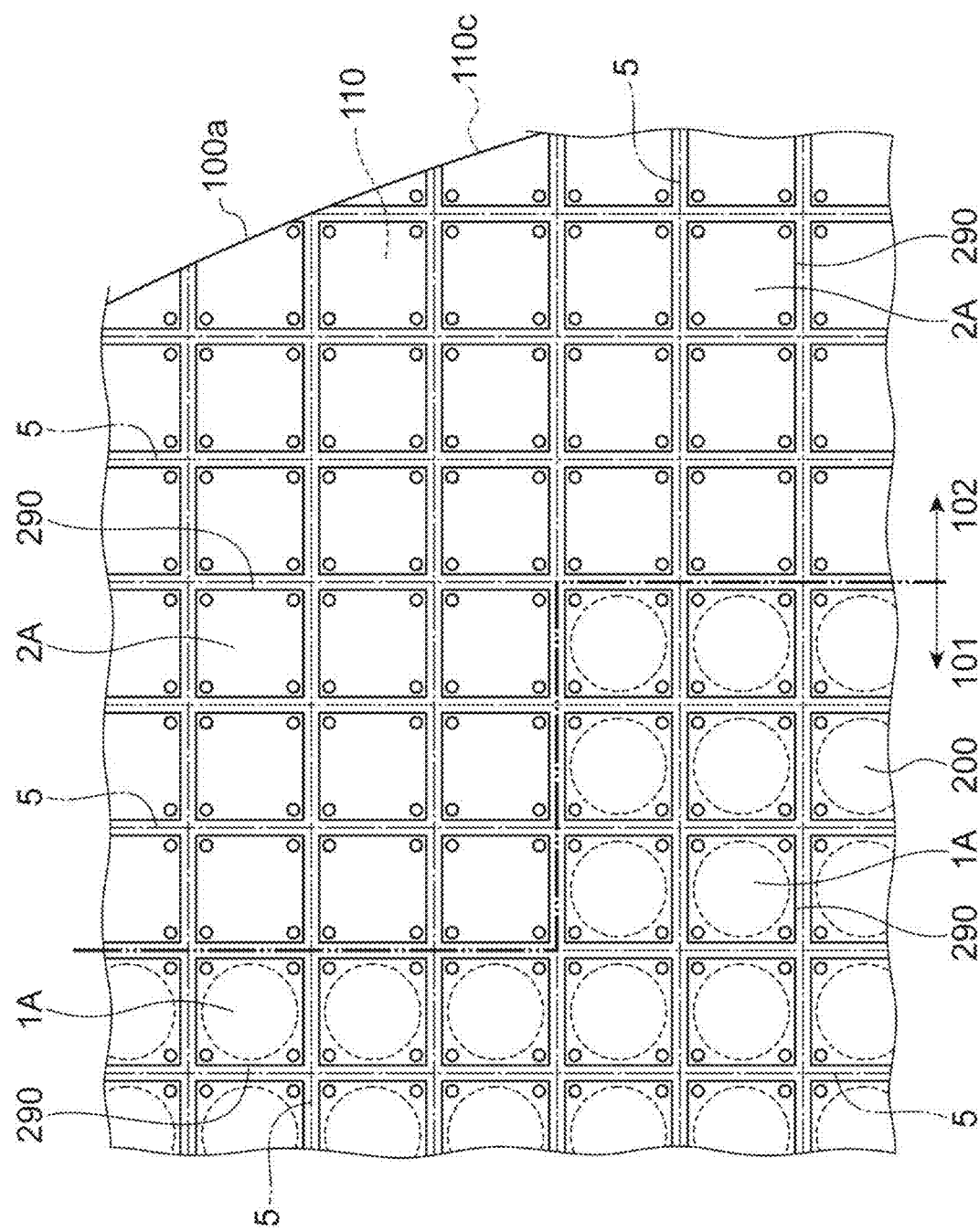
FIG. 6 is an enlarged plan view of a portion of the wafer illustrated in FIG. 5.

Next, a configuration of a wafer as an inspection target of an electrical inspection method according to one embodiment will be described. As illustrated in FIGS. 5 and 6, a wafer 100 includes a substrate layer 110. The substrate layer 110 has a disk shape, with an orientation flat OF formed in a portion of the substrate layer 110. For example, the substrate layer 110 is formed of silicon, quartz, glass or the like. Hereinafter, a virtual straight line that passes through the center of the substrate layer 110 when viewed in the thickness direction of the substrate layer 110 and is parallel to the orientation flat OF is referred to as a first straight line 3, while a virtual straight line that passes through the center of the substrate layer 110 when viewed in the thickness direction of the substrate layer 110 and is perpendicular to the orientation flat OF is referred to as a second straight line 4.

The wafer 100 includes an effective area 101 and a dummy area 102. The dummy area 102 is an area along an outer edge 110c of the substrate layer 110 (that is, the outer edge 100a of the wafer 100). The effective area 101 is an area inside the dummy area 102. The dummy area 102 surrounds the effective area 101 when viewed in the thickness direction of the substrate layer 110. The dummy area 102 is adjacent to the effective area 101.

The effective area 101 includes a plurality of two-dimensionally arranged Fabry-Perot interference filter portions 1A. The plurality of Fabry-Perot interference filter portions 1A is provided in the entire effective area 101. The dummy area 102 includes a plurality of two-dimensionally arranged dummy filter portions 2A. The plurality of dummy filter portions 2A is provided in an area of the dummy area 102 excluding a pair of areas 102a. One area 102a is an area along the orientation flat OF. The other area 102a is an area along the portion of the outer edge 110c of the substrate layer 110 on the side opposite to the orientation flat OF. The Fabry-Perot interference filter portion 1A and the dummy filter portion 2A are adjacent to each other at a boundary between the effective area 101 and the dummy area 102. When viewed in the thickness direction of the substrate layer 110, the outer shape of the Fabry-Perot interference filter portion 1A and the outer shape of the dummy filter portion 2A are the same. The plurality of Fabry-Perot interference filter portions 1A and the plurality of dummy filter portions 2A are arranged so as to be symmetric about each of the first straight line 3 and the second straight line 4 orthogonal to each other. The plurality of dummy filter portions 2A may be provided over the entire dummy area 102. Furthermore, the plurality of dummy filter portions 2A may be provided in an area other than one of the areas 102a in the dummy areas 102.

Each of the plurality of Fabry-Perot interference filter portions 1A is to be each of a plurality of Fabry-Perot interference filters 1 when the wafer 100 is cut along each of lines 5. Each of the plurality of dummy filter portions 2A is to be each of a plurality of dummy filters 2 when the wafer 100 is cut along each of the lines 5. When viewed in the thickness direction of the substrate layer 110, the plurality of lines 5 extends in a direction parallel to the orientation flat OF, and the plurality of lines 5 extends in a direction perpendicular to the orientation flat OF. As an example, when each of the filter portions 1A and 2A has a rectangular shape when viewed in the thickness direction of the substrate layer 110, each of the filter portions 1A and 2A is arranged in a two-dimensional matrix, and the plurality of lines 5 is set in a lattice pattern so as to pass between adjacent filter portions 1A-1A, between adjacent filter portions 1A-2A, and between adjacent filter portions 2A-2A.

Figure 7:
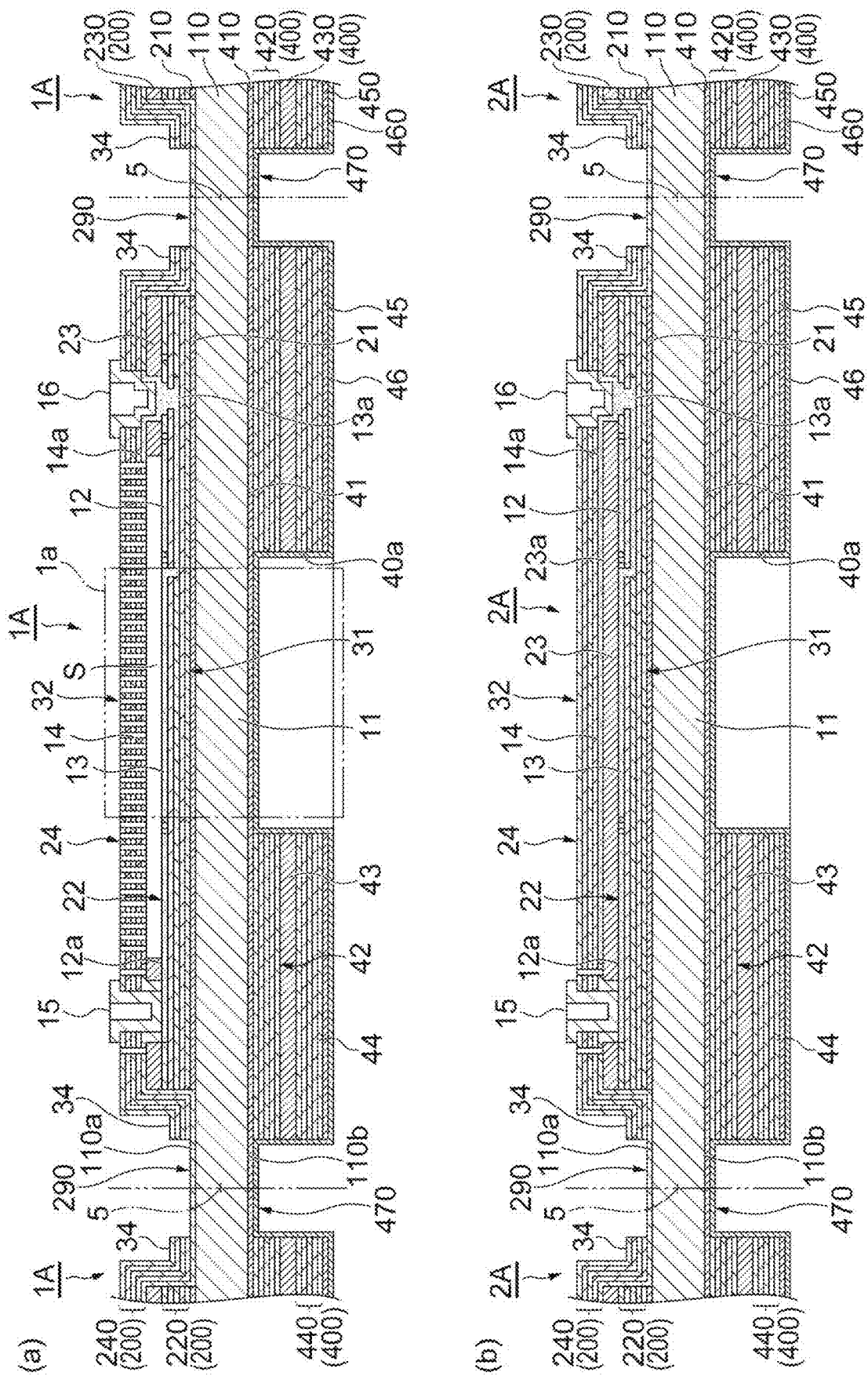
FIG. 7 is a cross-sectional view of a Fabry-Perot interference filter portion and a dummy filter portion of the wafer illustrated in FIG. 5.

(a) of FIG. 7 is a cross-sectional view of the Fabry-Perot interference filter portion 1A. (b) of FIG. 7 is a cross-sectional view of the dummy filter portion 2A. As illustrated in (a) and (b) of FIG. 7, the substrate layer 110 is a layer that is to be a plurality of substrates 11 when the wafer 100 is cut along each of the lines 5. The substrate layer 110 has a first surface 110a and a second surface 110b opposite to the first surface 110a. A reflection prevention layer 210 is provided on the first surface 110a of the substrate layer 110. The reflection prevention layer 210 is a layer to be a plurality of reflection prevention layers 21 when the wafer 100 is cut along each of the lines 5. A reflection prevention layer 410 is provided on the second surface 110b of the substrate layer 110. The reflection prevention layer 410 is a layer to be a plurality of reflection prevention layers 41 when the wafer 100 is cut along each of the lines 5.

A device layer 200 is provided on the reflection prevention layer 210. The device layer 200 includes a first mirror layer 220, an intermediate layer 230, and a second mirror layer 240. The first mirror layer 220 is a layer having a plurality of first mirror portions 31, and is a layer to be a plurality of first laminates 22 when the wafer 100 is cut along each of the lines 5. The plurality of first mirror portions 31 is two-dimensionally arranged on the first surface 110a of the substrate layer 110 via the reflection prevention layer 210. The intermediate layer 230 is a layer to be a plurality of intermediate layers 23 when the wafer 100 is cut along each of the lines 5. The second mirror layer 240 is a layer having a plurality of second mirror portions 32, and is a layer to be a plurality of second laminates 24 when the wafer 100 is cut along each of the lines 5. The plurality of second mirror portions 32 is two-dimensionally arranged on the first mirror layer 220 via the intermediate layer 23.

A stress adjustment layer 400 is provided on the reflection prevention layer 410. That is, the stress adjustment layer 400 is provided on the second surface 110b of the substrate layer 110 via the reflection prevention layer 410. The stress adjustment layer 400 includes a plurality of layers 420, 430, and 440. The layer 420 is a layer that is to be a plurality of third laminates 42 when the wafer 100 is cut along each of the lines 5. The layer 430 is a layer to be a plurality of intermediate layers 43 when the wafer 100 is cut along each of the lines 5. The layer 440 is a layer to be a plurality of fourth laminates 44 when the wafer 100 is cut along each of the lines 5.

A light shielding layer 450 and a protective layer 460 are provided on the stress adjustment layer 400. The light shielding layer 450 is a layer that is to be a plurality of light shielding layers 45 when the wafer 100 is cut along each of the lines 5. The protective layer 460 is a layer that is to be a plurality of protective layers 46 when the wafer 100 is cut along each of the lines 5.

As illustrated in (a) of FIG. 7, each of the Fabry-Perot interference filter portions 1A has a gap S formed between the first mirror portion 31 and the second mirror portion 32 facing each other. That is, in each of the Fabry-Perot interference filter portions 1A, the intermediate layer 23 defines the gap S, and the second mirror portion 32 floats on the gap S. Similarly to the configuration of the Fabry-Perot interference filter 1 described above, each of the Fabry-Perot interference filter portions 1A includes a configuration related to the first electrode 12, the second electrode 13, the third electrode 14, the plurality of terminals 15 and 16, the opening 40a, and the like. Therefore, even when the plurality of Fabry-Perot interference filter portions 1A is still in the state of the wafer 100, applying a voltage to each of the Fabry-Perot interference filter portions 1A via the pair of terminals 15 and 16 would change the distance between the first mirror portion 31 and the second mirror portion 32 facing each other by the electrostatic force.

As illustrated in (b) of FIG. 7, each of the dummy filter portions 2A includes the intermediate layer 23 provided between the first mirror portion 31 and the second mirror portion 32 facing each other. That is, in the dummy filter portion 2A, the intermediate layer 23 does not define the gap S, and the second mirror portion 32 is disposed on the surface 23a of the intermediate layer 23. Accordingly, although each of the dummy filter portions 2A has a configuration related to the first electrode 12, the second electrode 13, the third electrode 14, the plurality of terminals 15 and 16, the openings 40a, and the like, similarly to the configuration of the dumnmy filter 2 described above, the distance between the first mirror portion 31 and the second mirror portion 32 facing each other would not change. Note that each of the dummy filter portions 2A does not need to include the configuration related to the first electrode 12, the second electrode 13, the third electrode 14, the plurality of terminals 15 and 16 (a metal film such as aluminum to form each of the terminal 15 and 16, through-holes for disposing each of the terminals 15 and 16, and the like), the opening 40a, and the like.

As illustrated in FIG. 6 and (a) of FIG. 7, the device layer 200 has a first groove 290 opening on the side opposite to the substrate layer 110. The first groove 290 is formed along each of the lines 5. The first groove 290 surrounds the first mirror portion 31, the intermediate layer 23, and the second mirror portion 32 in each of the Fabry-Perot interference filter portions 1A and each of the dummy filter portions 2A. In each of the Fabry-Perot interference filter portions 1A, the first mirror portion 31, the intermediate layer 23, and the second mirror portion 32 are surrounded by the annularly continuous first groove 290. Similarly, in each of the dummy filter portions 2A, the first mirror portion 31, the intermediate layer 23, and the second mirror portion 32 are surrounded by the annularly continuous first groove 290. Focusing on the adjacent filter portions 1A-1A, the adjacent filter portions 1A-2A, and the adjacent filter portions 2A-2A, the first groove 290 corresponds to a region on a peripheral edge portion 34 of one filter portion and a peripheral edge portion 34 of the other filter portion. The first groove 290 is continuous through the effective area 101 and the dummy area 102, and reaches the outer edge 110c of the substrate layer 110 when viewed in a direction in which the first mirror portion 31 and the second mirror portion 32 face each other (hereinafter, simply referred to as a "facing direction"). It is sufficient as long as the first groove 290 surrounds at least the second mirror portion 32 in each of the Fabry-Perot interference filter portions 1A and each of the dummy filter portions 2A.

As illustrated in (b) of FIG. 7, the stress adjustment layer 400 has a second groove 470 opening on the side opposite to the substrate layer 110. The second groove 470 is formed along each of the lines 5. That is, the second groove 470 is formed so as to correspond to the first groove 290. Here, formation of the second groove 470 corresponding to the first groove 290 means that the second groove 470 overlaps the first groove 290 when viewed in the facing direction. Therefore, the second groove 470 is continuous in the effective area 101 and the dummy area 102 and reaches the outer edge 110c of the substrate layer 110 when viewed in the facing direction.

[Method of Manufacturing Wafer]

Next, a method of manufacturing the wafer 100 will be described with reference to FIGS. 8 to 13. In FIGS. 8 to 13, (a) is cross-sectional view of a portion corresponding to the Fabry-Perot interference filter portion 1A, and (b) is a cross-sectional view of a portion corresponding to the dummy filter portion 2A.

First, as illustrated in FIG. 8, the reflection prevention layer 210 is formed on the first surface 110a of the substrate layer 110, while the reflection prevention layer 410 is formed on the second surface 110b of the substrate layer 110. Subsequently, a plurality of polysilicon layers and a plurality of silicon nitride layers are alternately laminated on each of the reflection prevention layers 210 and 410, so as to form the first mirror layer 220 on the reflection prevention layer 210 and form the layer 420 on the reflection prevention layer 410.

When the first mirror layer 220 is formed, etching is performed to remove a portion along each of the lines 5 in the first mirror layer 220 so as to expose the surface of the reflection prevention layer 210. In addition, by doping impurities to achieve low resistivity in a portion of a predetermined polysilicon layer in the first mirror layer 220, the first electrode 12, the second electrode 13, and the wiring 12a and 13a are formed in each of portions corresponding to the substrate 11. Moreover, etching is performed to form the trenches 17 and 18 on a surface of the first mirror layer 220 in each of portions corresponding to the substrate 11.

Figure 9:
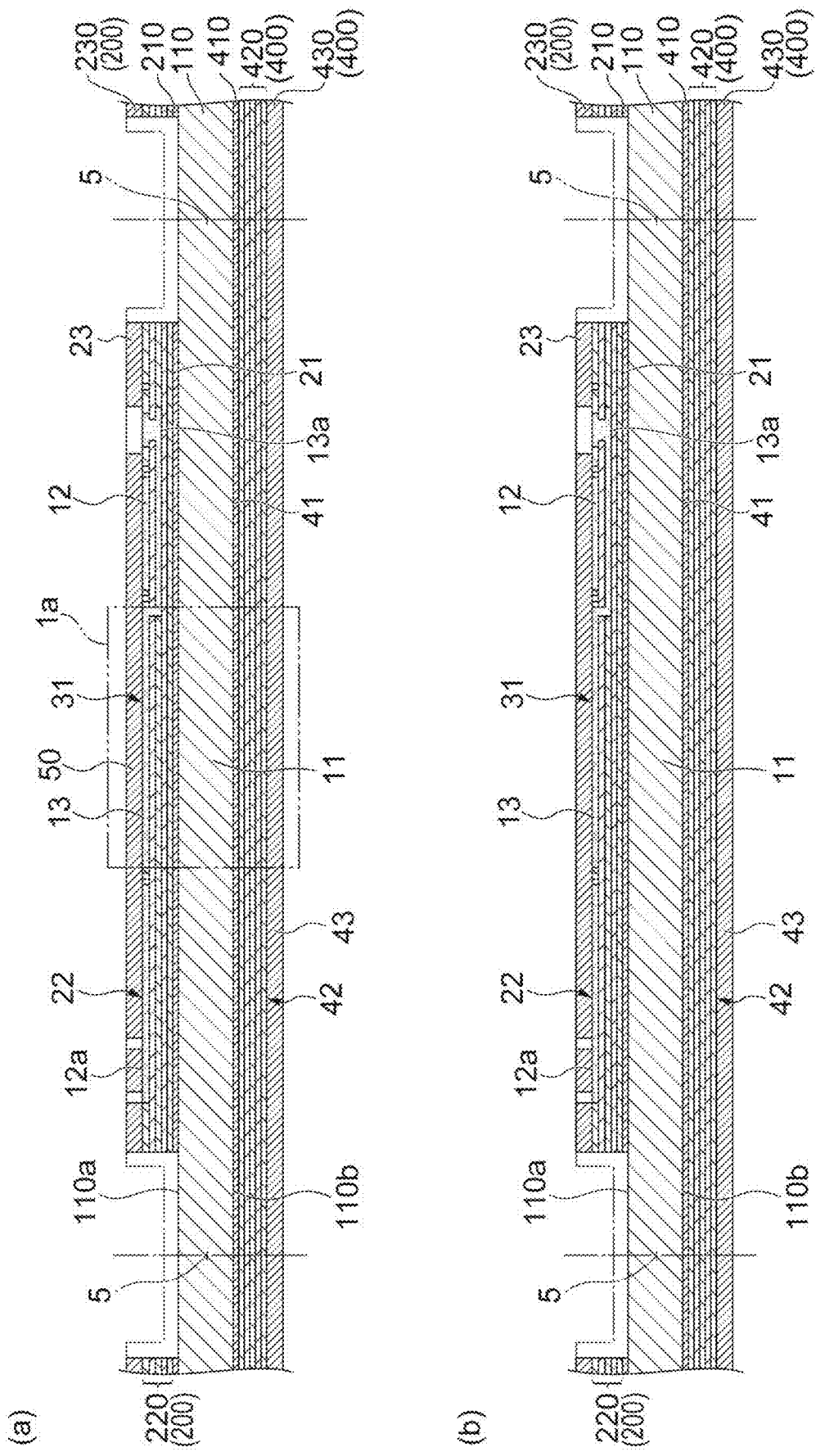
FIG. 9 is a cross-sectional view illustrating a method for manufacturing the wafer illustrated in FIG. 5.

Subsequently, as illustrated in FIG. 9, the intermediate layer 230 is formed on the first mirror layer 220 and on the exposed surface of the reflection prevention layer 210, and the layer 430 is formed on the layer 420. At a portion corresponding to each of the Fabry-Perot interference filter portions 1A, the intermediate layer 230 includes a portion 50 expected to be removed corresponding to the gap S (refer to FIG. 3). Subsequently, etching is performed to remove a portion along each of the lines 5 in the intermediate layer 230 and the reflection prevention layer 210 so as to expose the first surface 110a of the substrate layer 110. In addition, the etching is performed to form a gap at a portion corresponding to each of the terminals 15 and 16 (refer to FIG. 3) in the intermediate layer 230 for each of portions corresponding to the substrate 11.

Figure 10:
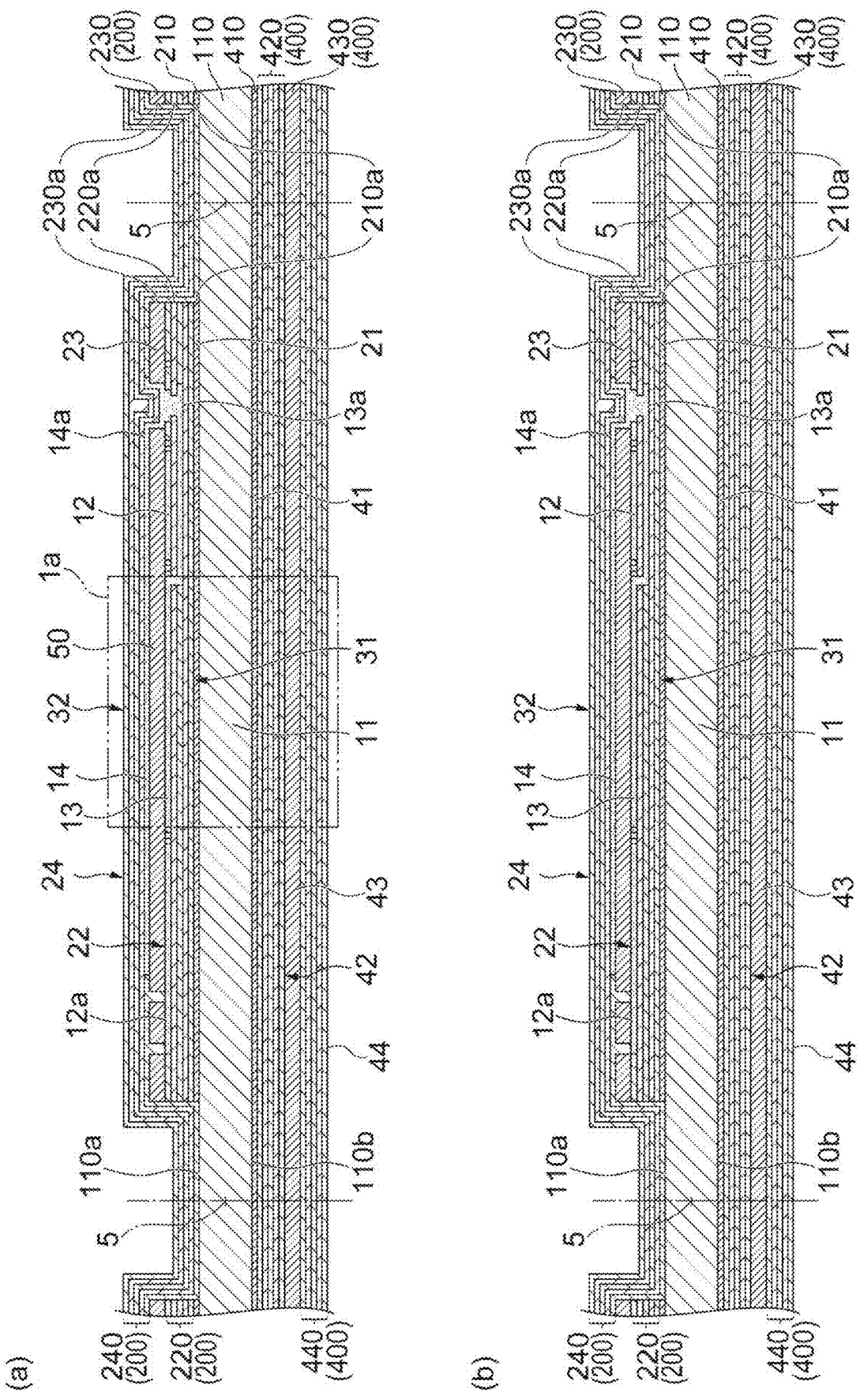
FIG. 10 is a cross-sectional view illustrating a method for manufacturing the wafer illustrated in FIG. 5.

Subsequently, as illustrated in FIG. 10, a plurality of polysilicon layers and a plurality of silicon nitride layers are alternately laminated on each of the first surface 110a side and the second surface 110b side of the substrate layer 110, thereby forming the second mirror layer 240 on the intermediate layer 230 and on the exposed first surface 110a of the substrate layer 110, as well as forming the layer 440 on the layer 430.

When the second mirror layer 240 is formed, side surfaces 230a of the intermediate layer 230, side surfaces 220a of the first mirror layer 220, and side surfaces 210a of the reflection prevention layer 210, facing each other along the line 5, are covered with the second mirror layer 240. In addition, by doping impurities to achieve low resistivity in a portion of a predetermined polysilicon layer in the second mirror layer 240, the third electrode 14 and the wiring 14a are formed in each of portions corresponding to the substrate 11.

Figure 11:
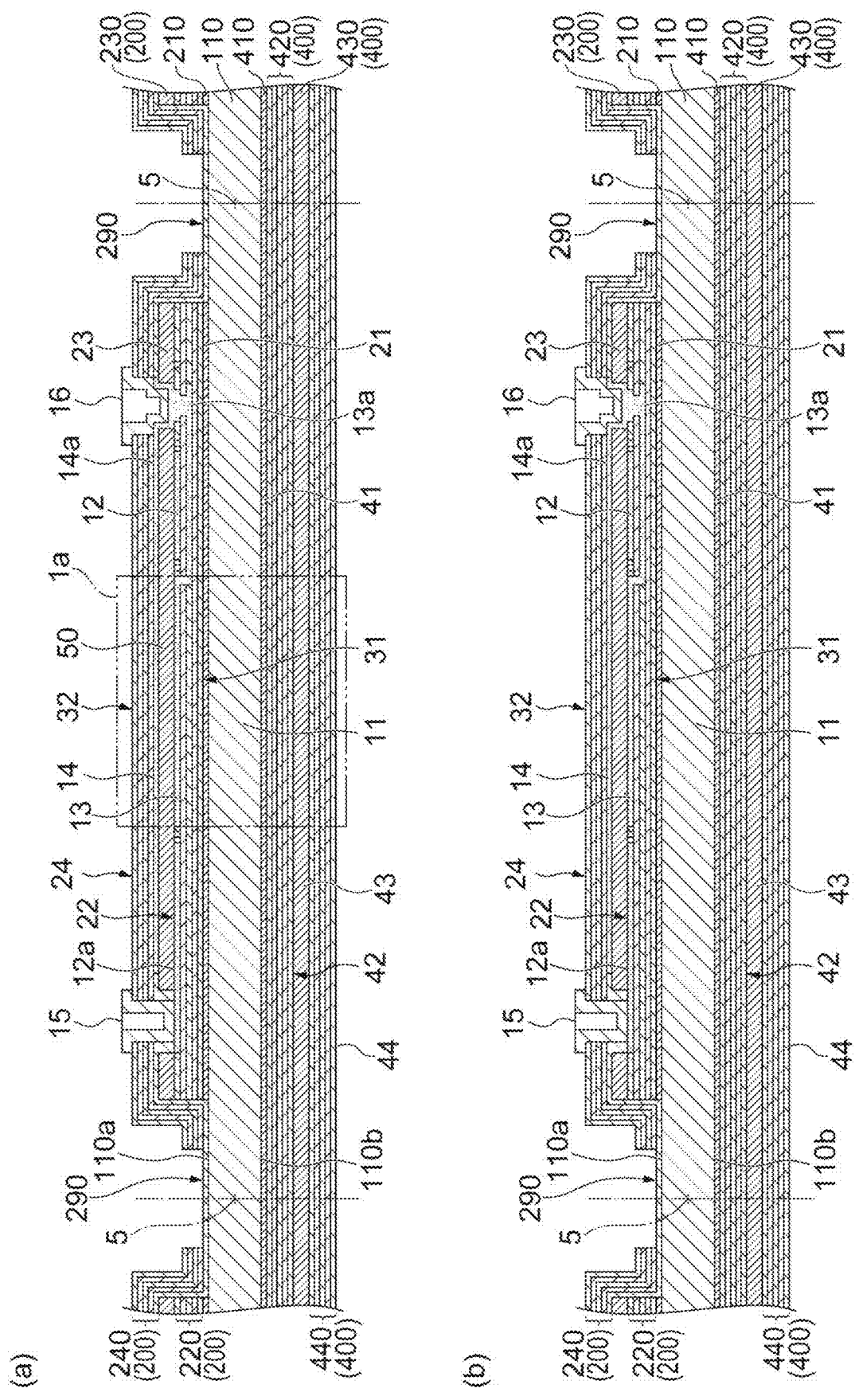
FIG. 11 is a cross-sectional view illustrating a method for manufacturing the wafer illustrated in FIG. 5.

Subsequently, as illustrated in (b) of FIG. 11, etching is performed to thin a portion along each of the lines 5 in the second mirror layer 240 so as to expose the surface of the polysilicon layer 27a (refer to FIG. 3) (that is, the polysilicon layer positioned closest to the first surface 110a side) included in the second mirror layer 240. In addition, the etching is performed to form a gap at a portion corresponding to each of the terminals 15 and 16 (refer to FIG. 3) in the second mirror layer 240 for each of portions corresponding to the substrate 11. Subsequently, the terminals 15 and 16 are formed in the gap for each of portions corresponding to the substrate 11, and the terminal 15 and the wiring 12a are connected to each other, while the terminal 16 and each of the wiring 13a and the wiring 14a are connected to each other.

With the procedure above, the reflection prevention layer 210 and the device layer 200 are formed on the first surface 110a of the substrate layer 110, while the first groove 290 is formed in the device layer 200. The first groove 290 is a region where the device layer 200 is partially thinned along each of the lines 5.

Figure 12:
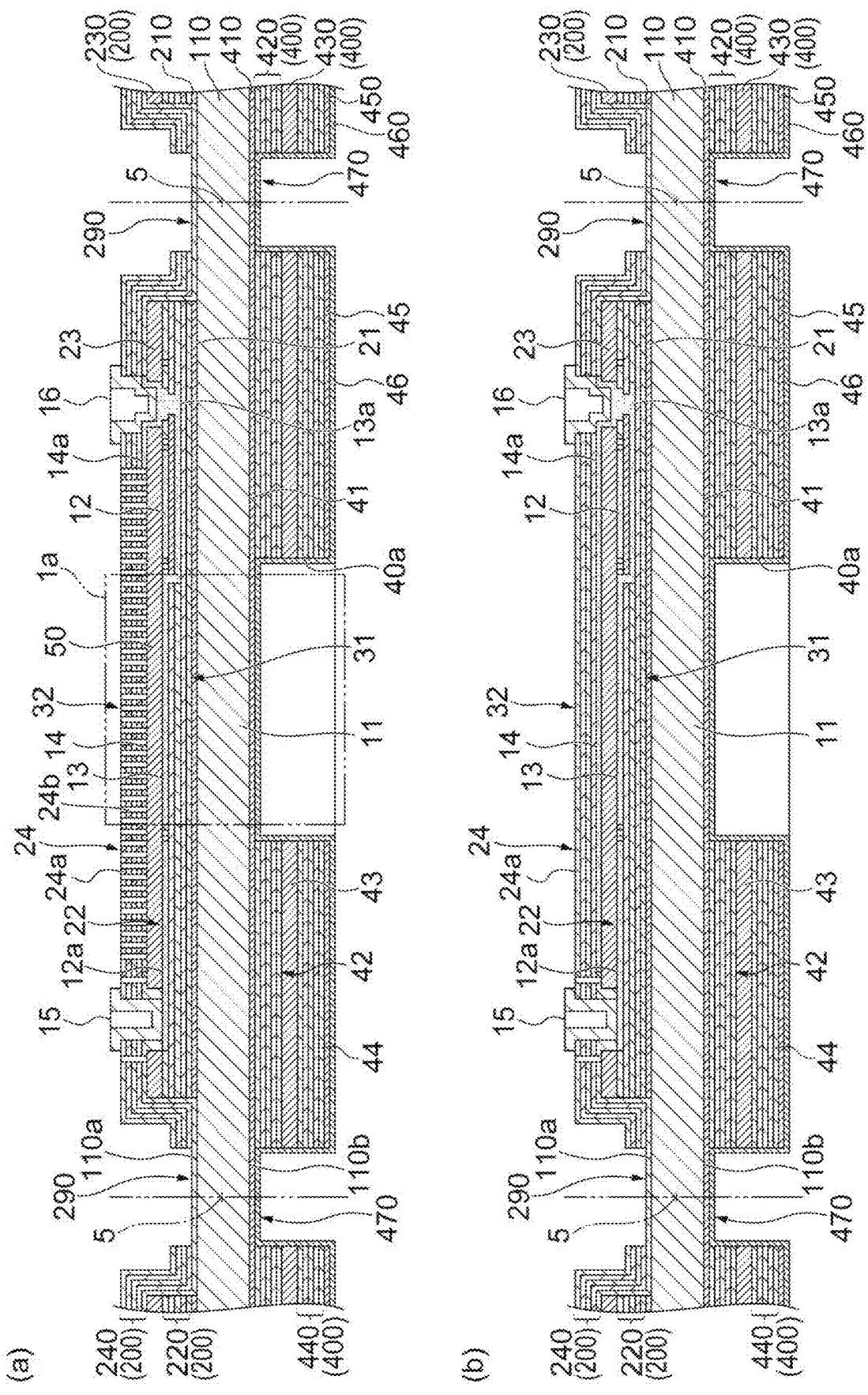
FIG. 12 is a cross-sectional view illustrating a method for manufacturing the wafer illustrated in FIG. 5.

Subsequently, as illustrated in (a) of FIG. 12, etching is performed in each of portions corresponding to the Fabry-Perot interference filter portion 1A so as to form, in the second laminate 24, the plurality of through-holes 24b leading from the surface 24a of the second laminate 24 to the portion 50 expected to be removed. At this time, as illustrated in (b) of FIG. 12, the plurality of through-holes 24b will not be formed in the second laminate 24 in a portion corresponding to each of the dummy filter portions 2A. Subsequently, as illustrated in FIG. 12, the light shielding layer 450 is formed on the layer 440. Subsequently, etching is performed to remove a portion along each of the lines 5 in the light shielding layer 450 and the stress adjustment layer 400 (that is, the layers 420, 430, and 440) so as to expose the surface of the reflection prevention layer 410. In addition, the etching is performed to form the opening 40a in each of portions corresponding to the substrate 11. Subsequently, the protective layer 460 is formed on the light shielding layer 450, the exposed surface of the reflection prevention layer 410, an inner surface of the opening 40a, and the side surface of the stress adjustment layer 400 facing the second groove 470.

With the procedure above, the reflection prevention layer 410, the stress adjustment layer 400, the light shielding layer 450, and the protective layer 460 are formed on the second surface 110b of the substrate layer 110, while the second groove 470 is formed in the stress adjustment layer 400. The second groove 470 is a region in which the stress adjustment layer 400 is partially thinned along each of the lines 5.

Figure 13:
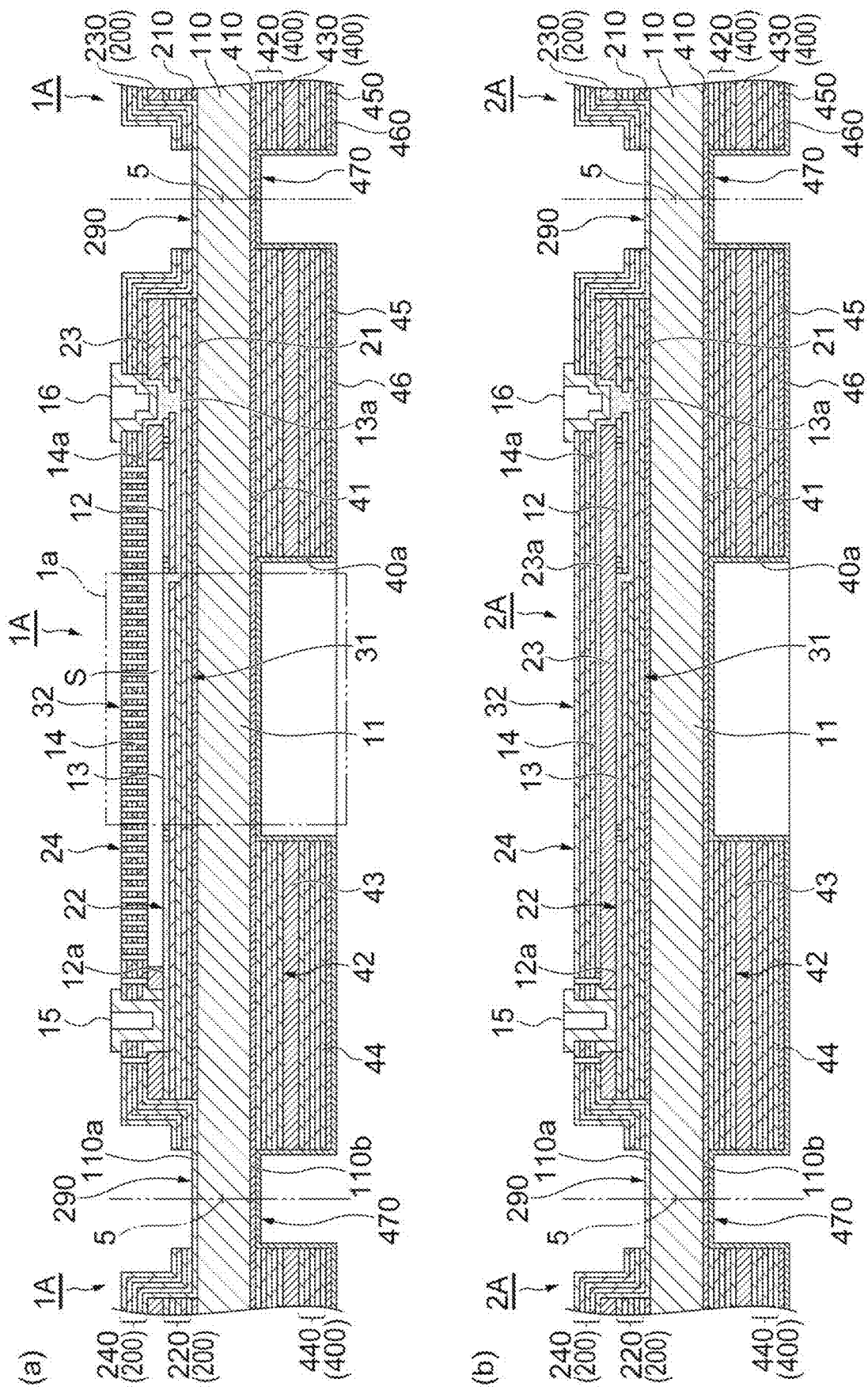
FIG. 13 is a cross-sectional view illustrating a method for manufacturing the wafer illustrated in FIG. 5.

Subsequently, as illustrated in (a) of FIG. 13, etching via a plurality of through-holes 24b (for example, gas phase etching using hydrofluoric acid gas) is performed at a portion corresponding to each of the Fabry-Perot interference filter portions 1A to collectively remove the plurality of portions 50 expected to be removed, from the intermediate layer 230. With this procedure, a gap S is formed in the portion corresponding to each of the Fabry-Perot interference filter portions 1A for each of portion corresponding to the substrate 11. At this time, as illustrated in (b) of FIG. 13, since the plurality of through-holes 24b is not formed in the second laminate 24 at the portion corresponding to each of the dummy filter portions 2A, the gap S will not be formed in the intermediate layer 230.

With the procedure described above, as illustrated in (a) of FIG. 7, the gap S is formed between the first mirror portion 31 and the second mirror portion 32 facing each other in the effective area 101, thereby forming the plurality of Fabry-Perot interference filter portions 1A. In contrast, in the dummy area 102, the intermediate layer 23 is provided between the first mirror portion 31 and the second mirror portion 32 facing each other as illustrated in (b) of FIG. 7, thereby forming the plurality of dummy filter portion 2A.

[Configuration of Electrical Inspection Device]

Figure 14:
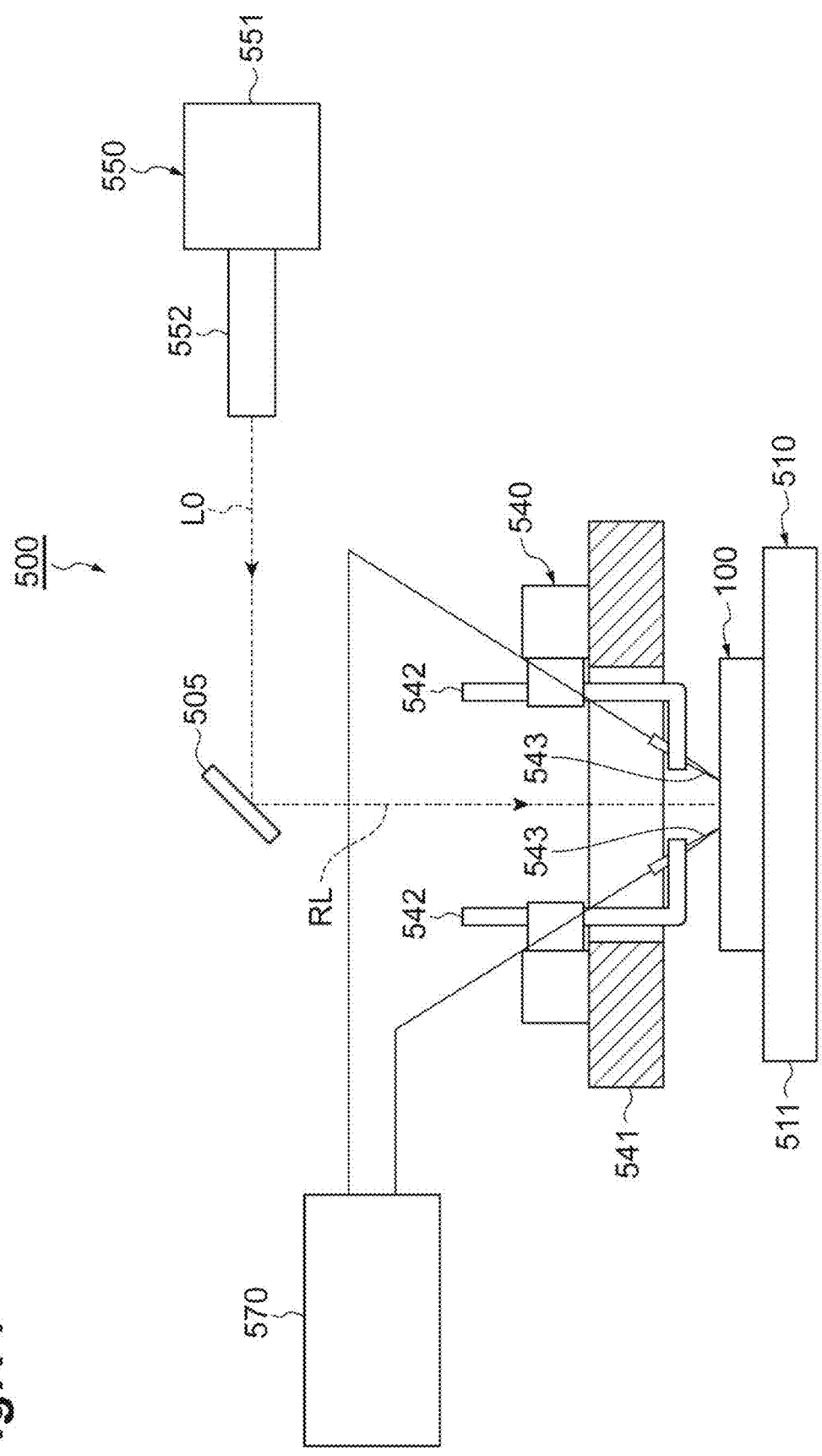
FIG. 14 is a configuration diagram of an electrical inspection device in which an electrical inspection method according to one embodiment is implemented.

Next, a configuration of an electrical inspection device in which the electrical inspection method of an embodiment is implemented will be described. As illustrated in FIG. 14, the electrical inspection device 500 includes a wafer support unit 510, a voltage application unit 540, an imaging unit 550, and a measurement unit 570. The wafer support unit 510, the voltage application unit 540, and the imaging unit 550 are disposed in a dark chamber (not illustrated). The inspection target of the electrical inspection device 500 is the wafer 100.

The wafer support unit 510 supports wafer 100 such that the facing direction of wafer 100 (that is, the direction in which first mirror portion 31 and second mirror portion 32 face each other) is substantially parallel to a reference line RL. Note that it is sufficient as long as the wafer support unit 510 supports the wafer 100 such that the facing direction of wafer 100 follows along the reference line RL. That is, the wafer support unit 510 does not need to support the wafer 100 such that the facing direction of the wafer 100 is completely parallel to the reference line RL. The wafer support unit 510 includes a stage 511. The stage 511 is movable along a plane perpendicular to the reference line RL (at least along each of two directions parallel to the plane and orthogonal to each other). The stage 511 may be rotatable around a line parallel to the reference line RL as a center line.

The voltage application unit 540 applies a voltage to each of the Fabry-Perot interference filter portions 1A. The voltage application unit 540 includes a stage 541, a pair of arms 542, and a pair of probe needles 543. The stage 541 is movable in a direction parallel to the reference line RL. The pair of arms 542 are attached to the stage 541. The pair of probe needles 543 are attached to the pair of arms 542. The pair of arms 542 and the pair of probe needles 543 are provided as a micromanipulator. The distance between the distal ends of the pair of probe needles 543 is adjusted to the distance between the pair of terminals 15 and 16 in each of the Fabry-Perot interference filter portions 1A. Note that the stage 541 need not be configured to be movable in a case where the stage 511 is configured to be movable in a direction parallel to the reference line RL in the wafer support unit 510.

The imaging unit 550 images the wafer 100 (specifically, the surface of the wafer 100) supported by the wafer support unit 510. The imaging unit 550 includes a camera 551 and a zoom lens 552. The camera 551 emits light L0 for observation, detects the light L0 reflected on the surface of the wafer 100 supported by the wafer support unit 510, and displays an obtained image on a display (not illustrated). The zoom lens 552 has a function of enlarging an image on the surface of the wafer 100. The light L0 emitted from the camera 551 is reflected by the mirror 505 so as to travel on the reference line RL. The light L0 reflected by the mirror 505 travels on the reference line RL, and is reflected on the surface of the wafer 100 supported by the wafer support unit 510. The light L0 reflected on the surface of the wafer 100 travels on the same optical path in the opposite direction so as to be incident on the camera 551 via the zoom lens 552. Note that the imaging unit 550 may be arranged on the reference line RL. In that case, the mirror 505 becomes unnecessary.

The measurement unit 570 has a function as at least one of an LCR meter or a source measure unit. Here, measurement unit 570 has functions of both an LCR meter and a source measure unit, and can switch the functions according to the purpose of the inspection.

In a case where the measurement unit 570 functions as an LCR meter, the measurement unit 570 measures the capacitance between the pair of terminals 15 and 16 without providing a potential difference between the pair of probe needles 543. The measurement unit 570 can also provide a potential difference between the pair of probe needles 543 and apply a voltage between the pair of terminals 15 and 16 to measure the capacitance. The capacitance corresponds to electrostatic capacitance generated between the first electrode 12 and the third electrode 14 in each of the Fabry-Perot interference filter portions 1A. Measuring the capacitance makes it possible to inspect the presence or absence of breakage in the second mirror portion 32 or the presence or absence of disconnection in the wiring 12a, 13a, or 14a, or the like. In addition, the relationship between the magnitude of the applied voltage and the capacitance can be obtained by changing the magnitude of the voltage applied between the pair of terminals 15 and 16 and measuring the capacitance at each of the voltages. The capacitance corresponds to the distance between the first mirror portion 31 and the second mirror portion 32 facing each other, and further corresponds to the wavelength of light transmitted through the first mirror portion 31 and the second mirror portion 32 facing each other. Accordingly, it is also possible to acquire the relationship between the level of the applied voltage and the wavelength of the transmitted light on the basis of the relationship between the level of the applied voltage and the capacitance.

In a case where the measurement unit 570 functions as a source measure unit, the measurement unit 570 provides a potential difference between the pair of probe needles 543 and applies a voltage between the pair of terminals 15 and 16 to measure the leakage current. The leakage current corresponds to the leakage current generated in each of the Fabry-Perot interference filter portions 1A between the terminal 15 side (electrical route from the terminal 15 to the first electrode 12 via the wiring 12a) and the terminal 16 side (electrical route from the terminal 16 to the second electrode 13 via the wiring 13a and an electrical route from the terminal 16 to the third electrode 14 via the wiring 14a). Measuring the leakage current makes it possible to inspect the presence or absence of a foreign substance in the gap S, the presence or absence of disconnection in the wirings 12a, 13a, or 14a, or the like.

In the electrical inspection device 500 configured as described above, the operation of each of units is controlled by a control unit (not illustrated), so that the electrical inspection method is performed as follows. First, a wafer 100 as an inspection target is prepared and supported by the wafer support unit 510. At this time, the wafer 100 is supported by the wafer support unit 510 such that the facing direction follows along the reference line RL. Subsequently, the wafer 100 supported by the wafer support unit 510 is imaged by the imaging unit 550, allowing an image of the wafer 100 to be displayed on the display. Thereafter, for example, an image of the wafer 100 displayed on the display is visually observed, and deviation of the wafer 100 (for example, the center position of the wafer 100) from a predetermined initial position (predetermined coordinates) will be corrected. With this operation, the control unit can acquire coordinate information of each of the Fabry-Perot interference filter portions 1A on the wafer 100 supported by the wafer support unit 510, as a relative position with respect to the predetermined initial position. Note that the imaging unit 550 may be connected to the control unit, and the control unit may acquire the coordinate information of each of the Fabry-Perot interference filter portions 1A on the wafer 100 on the basis of imaging data output from the imaging unit 550.

Subsequently, the stage 511 of the wafer support unit 510 is controlled to operate on the basis of the coordinate information, and one Fabry-Perot interference filter portion 1A is controlled to be located on the reference line RL (hereinafter, the one Fabry-Perot interference filter portion 1A located on the reference line RL will simply be referred to as the "one Fabry-Perot interference filter portion 1A"). Subsequently, the stage 541 of the voltage application unit 540 is controlled to operate, and the pair of probe needles 543 of the voltage application unit 540 is brought into contact with the pair of terminals 15 and 16 of the one Fabry-Perot interference filter portion 1A. Subsequently, the measurement unit 570 is controlled to operate, and the electrical characteristics of each of the Fabry-Perot interference filter portions 1A are inspected. Specifically, the capacitance is measured between the pair of terminals 15 and 16. Alternatively, a voltage is applied between the pair of terminals 15 and 16, and the leakage current is measured. With this procedure, the control unit can determine whether one Fabry-Perot interference filter portion 1A is a non-faulty product, for the one Fabry-Perot interference filter portion 1A on the basis of a measurement result output from the measurement unit 570.

When the inspection of one Fabry-Perot interference filter portion 1A is completed, the stage 541 of the voltage application unit 540 is controlled to operate, and the pair of probe needles 543 of the voltage application unit 540 is separated from the pair of terminals 15 and 16 of the one Fabry-Perot interference filter portion 1A. Subsequently, next one Fabry-Perot interference filter portion 1A is positioned on the reference line RL, and the inspection of the next one Fabry-Perot interference filter portion 1A is similarly performed. Hereinafter, the inspection of each of the Fabry-Perot interference filter portions 1A is sequentially performed in a similar manner. With this configuration, the control unit can store information (inspection result) related to each of the Fabry-Perot interference filter portions 1A in association with the coordinate information of each of the Fabry-Perot interference filter portions 1A on the wafer 100. In addition, for a Fabry-Perot interference filter portion 1A that has been determined to be other than non-faulty products by a prior inspection (visual inspection, or the like), it is allowable to suppress the contact of the pair of probe needles 543 with a pair of terminals 15 and 16 (the electrical inspection may be omitted), and the electrical inspection may be performed on next one Fabry-Perot interference filter portion 1A to improve the inspection efficiency. Furthermore, an electrical inspection may be implemented on a predetermined percentage of the Fabry-Perot interference filter portions 1A among all the Fabry-Perot interference filter portions 1A on one wafer 100 so as to determine whether the one wafer 100 is a non-faulty product. That is, the electrical inspection for the Fabry-Perot interference filter portion 1A does not necessarily need to be performed for all the Fabry-Perot interference filter portions 1A in one wafer 100.

Figure 15:
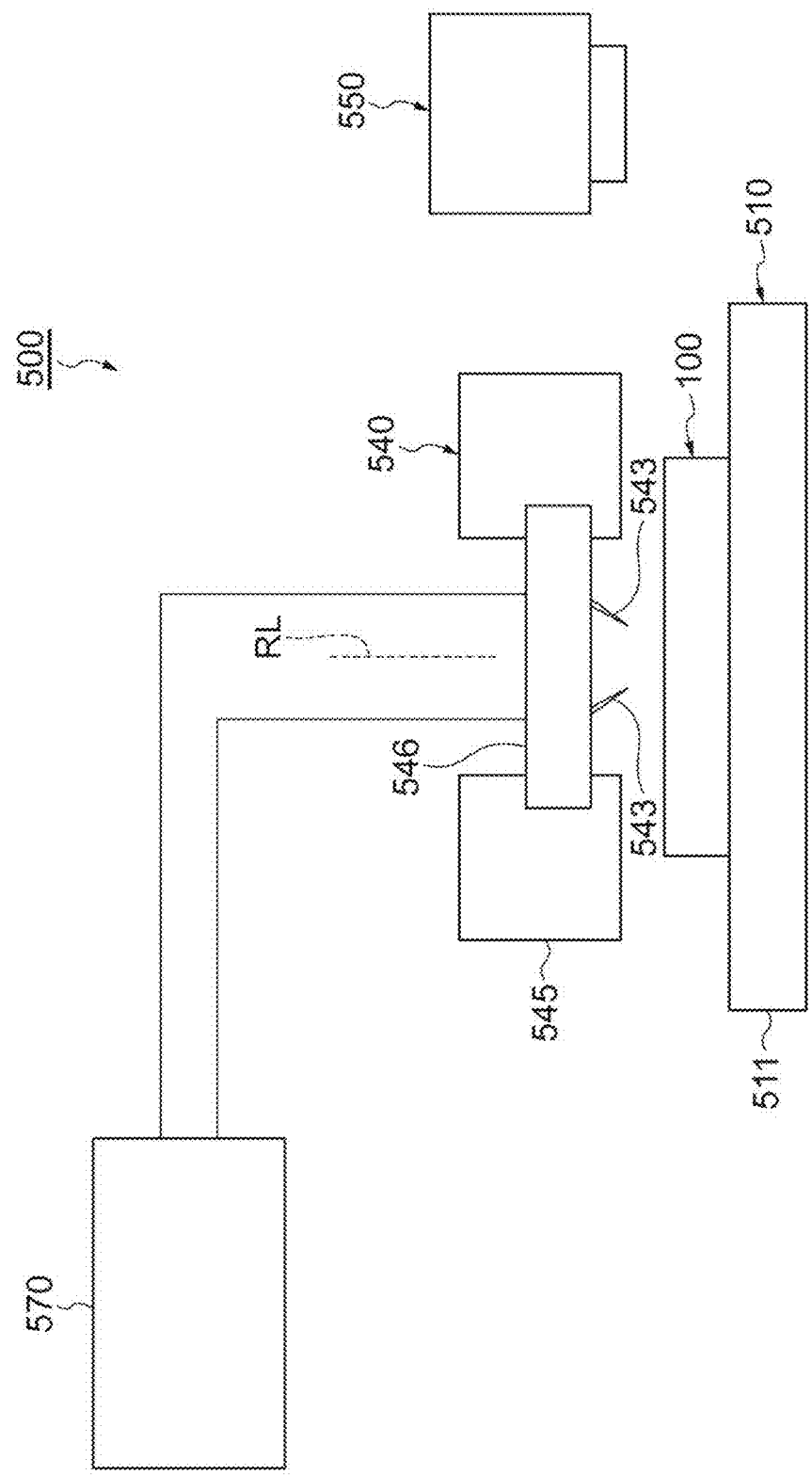
FIG. 15 is a configuration diagram of a modification of an electrical inspection device in which an electrical inspection method according to one embodiment is performed.

As illustrated in FIG. 15, a probe card may be applied to the voltage application unit 540. As an example, the voltage application unit 540 may include a support 545, a probe card 546, and a pair of probe needles 543. The probe card 546 is supported by the support 545. The pair of probe needles 543 are provided on the probe card 546. The distance between the distal ends of the pair of probe needles 543 is adjusted to the distance between the pair of terminals 15 and 16 in each of the Fabry-Perot interference filter portions 1A. In a case where the support 545 is fixed, the stage 511 of the wafer support unit 510 is movable in a direction parallel to the reference line RL. Furthermore, the imaging unit 550 may be disposed on the side of the voltage application unit 540. In that case, the stage 511 moves by a predetermined distance in a direction perpendicular to the reference line RL in the wafer support unit 510, whereby the imaging unit 550 captures an image of the wafer 100 supported by the wafer support unit 510.

[Method of Manufacturing Fabry-Perot Interference Filter]

Figure 16:
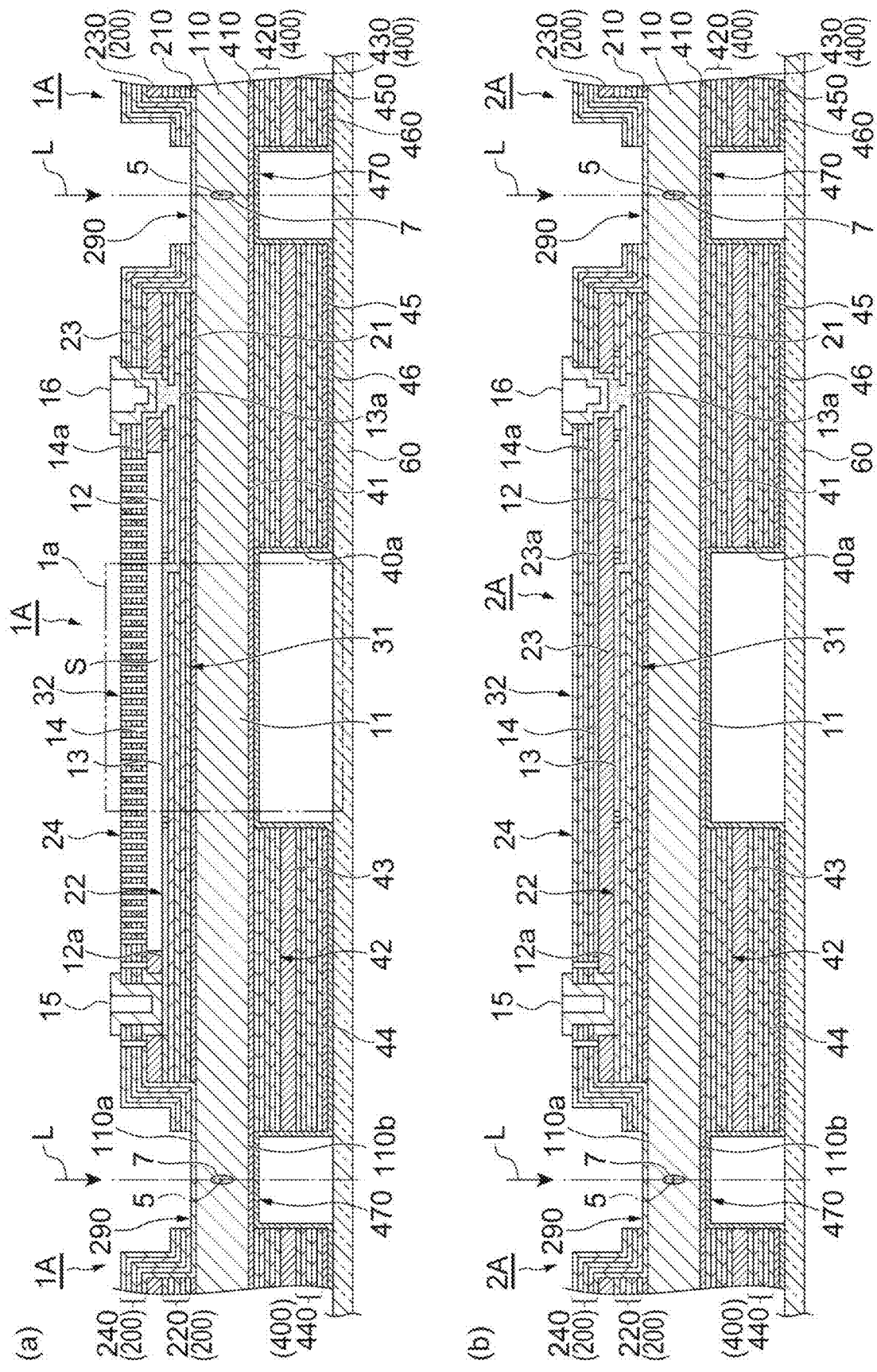
FIG. 16 is a cross-sectional view illustrating a method for cutting out a Fabry-Perot interference filter from the wafer illustrated in FIG. 5.
Figure 17:
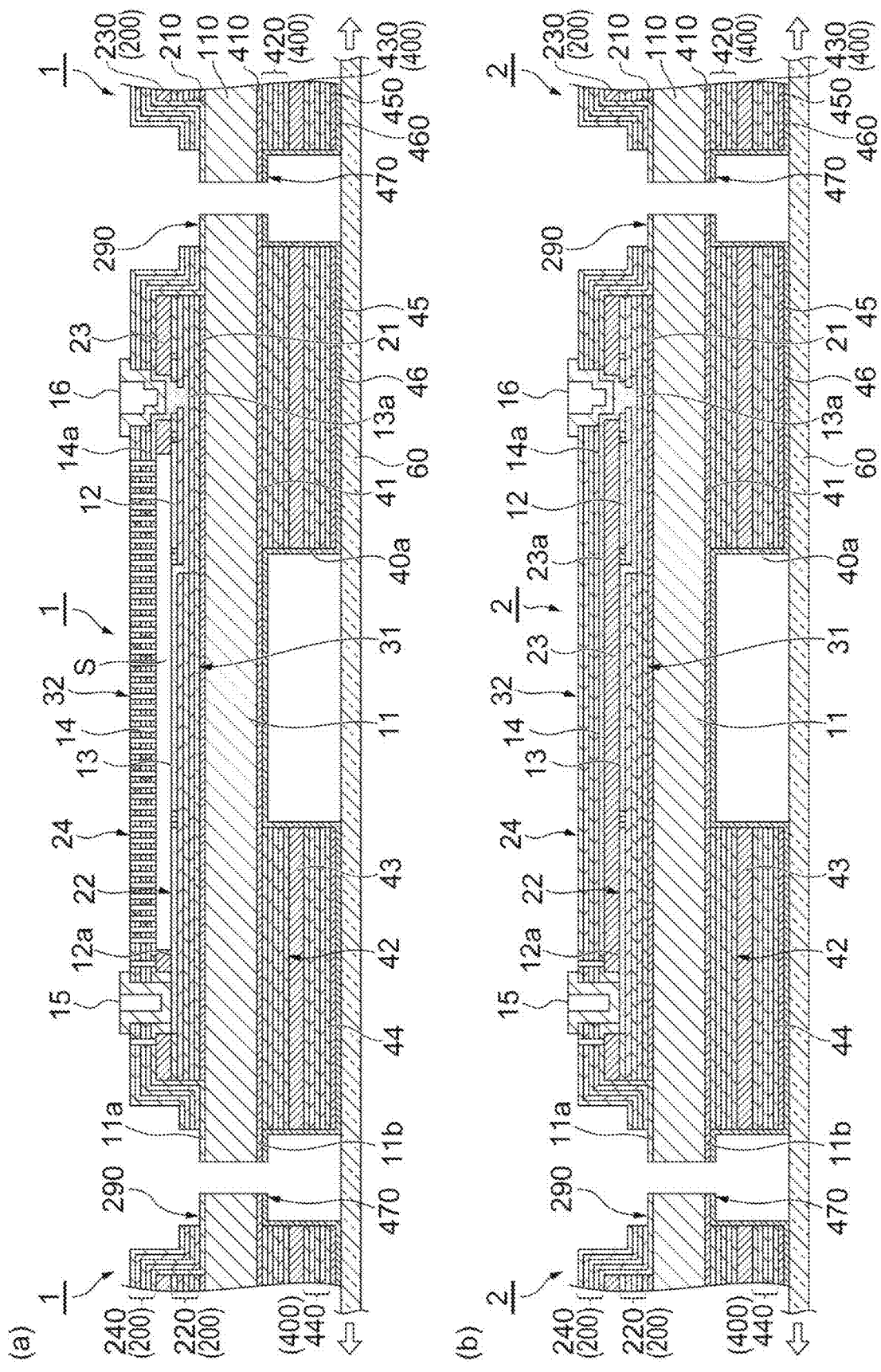
FIG. 17 is a cross-sectional view illustrating a method for cutting out a Fabry-Perot interference filter from the wafer illustrated in FIG. 5.

Next, a method for cutting out the Fabry-Perot interference filter 1 from the wafer 100 (a method of manufacturing the Fabry-Perot interference filter 1) will be described with reference to FIGS. 16 and 17. In FIGS. 16 and 17, (a) is cross-sectional view of a portion corresponding to the Fabry-Perot interference filter portion 1A, and (b) is a cross-sectional view of a portion corresponding to the dummy filter portion 2A.

First, as illustrated in FIG. 16, an expanding tape 60 is attached onto the protective layer 460 (that is, to the second surface 110b side). Subsequently, laser light L is applied from a side opposite to the expanding tape 60 in a state where the expanding tape 60 is attached to the second surface 110b side, and then a converging point of the laser light L is relatively moved along each of the lines 5 while a converging point of the laser light L is positioned within the substrate layer 110. That is, the laser light L is controlled to be incident on the substrate layer 110 from the side opposite to the expanding tape 60 through the surface of the polysilicon layer exposed in the first groove 290.

With the irradiation of the laser light L, a modified region 7 is formed within the substrate layer 110 along each of the lines 5. The modified region 7 is a region having physical characteristics such as density, a refractive index, mechanical strength different from those in the surrounding area, and is a region to be a start point of a fracture extending in a thickness direction of the substrate layer 110. Examples of the modified region 7 include molten processed regions (which means at least any one of a region resolidified after melting, a region in a melted state, and a region in a state of being resolidified from the melted state), a crack region, a dielectric breakdown region, a refractive index changed region, or the like, or a mixed region of these. Further examples of the modified region 7 include a region where the density of the modified region 7 has changed from that of an unmodified region, a region with a lattice defect, or the like, in the material of the substrate layer 110. When the material of the substrate layer 110 is monocrystalline silicon, the modified region 7 can also be defined as a high-dislocation density region. The number of rows of the modified regions 7 arranged in the thickness direction of the substrate layer 110 with respect to each of the lines 5 is appropriately adjusted based on the thickness of the substrate layer 110.

Subsequently, as illustrated in FIG. 17, the expanding tape 60 attached to the second surface 110b side is expanded so as to extend the fracture in the thickness direction of the substrate layer 110 from the modified region 7 formed within the substrate layer 110, and then, the substrate layer 110 is cut into the plurality of substrates 11 along each of the lines 5. At this time, the polysilicon layer of the second mirror layer 240 is cut along each of the lines 5 in the first groove 290, while the reflection prevention layer 410 and the protective layer 460 are cut along each of the lines 5 in the second groove 470. With this procedure, a plurality of Fabry-Perot interference filters 1 and the plurality of dummy filters 2 in a state of being separated from each other on the expanding tape 60 are obtained.

[Configuration of Light Detection Device]

Figure 18:
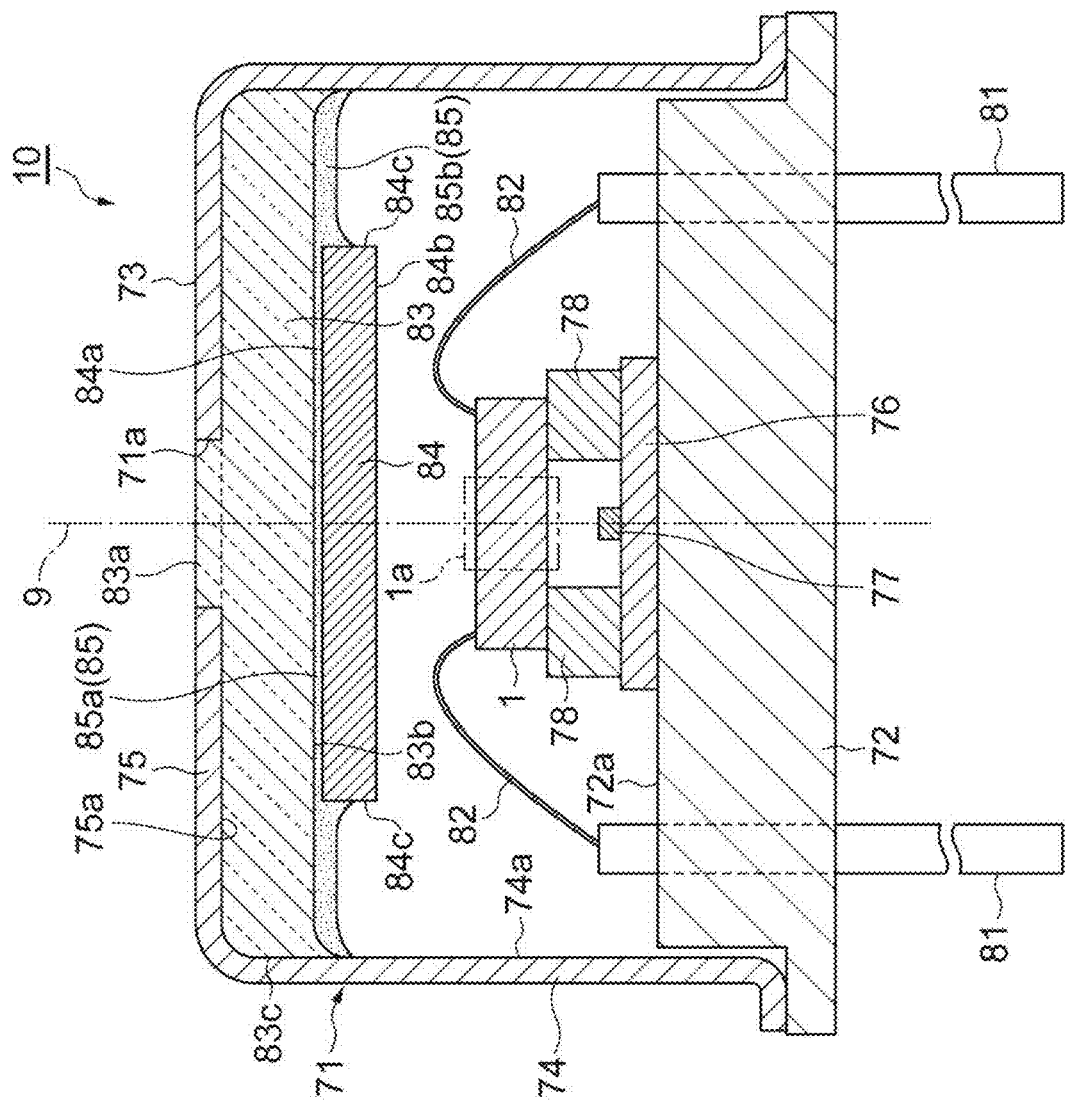
FIG. 18 is a cross-sectional view of a light detection device including a Fabry-Perot interference filter.

Next, a configuration of the light detection device 10 including the Fabry-Perot interference filter 1 will be described. As illustrated in FIG. 18, the light detection device 10 includes a package 71. The package 71 is a CAN package including a stem 72 and a cap 73. The cap 73 is integrally formed by a side wall 74 and a top wall 75. The stem 72 and the cap 73 are formed of a metal material and are hermetically joined to each other. In the package 71 formed of a metal material, the shape of the side wall 74 is cylindrical about a line 9 as a center line. The stem 72 and the top wall 75 face each other in a direction parallel to the line 9, and close both ends of the side wall 74, individually.

A wiring substrate 76 is secured to an inner surface 72a of the stem 72. Examples of a material applicable as the wiring substrate 76 include silicon, ceramic, quartz, glass, plastic, or the like. The light detector (light detection unit) 77 and a temperature detector (not illustrated) such as a thermistor are mounted on the wiring substrate 76. The light detector 77 is disposed on the line 9. More specifically, the light detector 77 is disposed such that the center line of a light receiving portion thereof is aligned with the line 9. The light detector 77 is an infrared detector such as a quantum type sensor using InGaAs or other compounds or a thermal type sensor using a thermopile or a bolometer or the like. In a case of detecting light of different wavelength bands of ultraviolet, visible, and near infrared regions, for example a silicon photodiode or the like can be used as the light detector 77. Note that the light detector 77 may include one light receiving portion, or a plurality of light receiving portions provided in an array. Furthermore, a plurality of light detectors 77 may be mounted on the wiring substrate 76. The temperature detector may be disposed at a position close to the Fabry-Perot interference filter 1, for example, so that a temperature change of the Fabry-Perot interference filter 1 can be detected.

A plurality of spacers 78 is secured onto the wiring substrate 76. Examples of a material applicable as the spacers 78 include silicon, ceramic, quartz, glass, plastic, or the like. The Fabry-Perot interference filter 1 is secured onto the plurality of spacers 78 by adhesive, for example. Fabry-Perot interference filter 1 is disposed on the line 9. More specifically, the Fabry-Perot interference filter 1 is disposed such that the center line of the light transmission region 1a is aligned with the line 9. Note that the spacers 78 may be integrally formed with the wiring substrate 76. The Fabry-Perot interference filter 1 may be supported by a single spacer 78, rather than by the plurality of spacers 78.

A plurality of lead pins 81 is secured to the stem 72. More specifically, each of the lead pins 81 penetrates through the stem 72 in a state where electrical insulation and hermeticity with the stem 72 are maintained. Each of the lead pins 81 is electrically connected by wires 82 to each of electrode pads provided on the wiring substrate 76, a terminal of the light detector 77, a terminal of the temperature detector, and a terminal of the Fabry-Perot interference filter 1. The light detector 77, the temperature detector, and the Fabry-Perot interference filter 1 may be electrically connected to each of the lead pins 81 via the wiring substrate 76. For example, each of terminals may be electrically connected to an electrode pad provided on the wiring substrate 76, while the electrode pad and each of the lead pins 81 may be connected by the wire 82. This enables input and output of electric signals to and from each of the light detector 77, the temperature detector, and the Fabry-Perot interference filter 1.

The package 71 has an opening 71a. More specifically, the opening 71a is formed in the top wall 75 of the cap 73 such that the center line thereof is aligned with the line 9. The shape of the opening 71a is circular when viewed in a direction parallel to the line 9. A light transmitting member 83 is disposed on an inner surface 75a of the top wall 75 so as to close the opening 71a. The light transmitting member 83 is hermetically joined to the inner surface 75a of the top wall 75. The light transmitting member 83 has a light incident surface 83a and a light emission surface 83b (inner surface) opposite to the light incident surface 83a in a direction parallel to line 9, and has side surfaces 83c. The light incident surface 83a of the light transmitting member 83 is substantially flush with an outer surface of the top wall 75 at the opening 71a. The side surface 83c of the light transmitting member 83 is in contact with an inner surface 74a of the side wall 74 of the package 71. That is, the light transmitting member 83 reaches the inside of the opening 71a and the inner surface 74a of the side wall 74. Such a light transmitting member 83 is formed by disposing a glass pellet inside the cap 73 with the opening 71a facing down and melting the glass pellet. That is, the light transmitting member 83 is formed of fused glass.

A band pass filter 84 is secured to the light emission surface 83b of the light transmitting member 83 by a bonding member 85. That is, the bonding member 85 secures the band pass filter 84 to the inner surface 75a of the top wall 75 via the light transmitting member 83 joined to the inner surface 75a of the top wall 75. The band pass filter 84 selectively transmits light with a measurement wavelength range by the light detection device 10 (light with a predetermined wavelength range and should be incident on the light transmission region 1a of the Fabry-Perot interference filter 1) out of light transmitted through the light transmitting member 83 (that is, the band pass filter 84 transmits only the light with the wavelength range). The band pass filter 84 has a rectangular plate shape. More specifically, the band pass filter 84 has a light incident surface 84a and a light emission surface 84b opposite to the light incident surface 84a in a direction parallel to the line 9, and has four side surfaces 84c. The band pass filter 84 is obtained by forming a dielectric multilayer film (for example, a multilayer film combining a high refractive material such as TiO$_2$, Ta$_2$O$_5$, or the like and a low refractive material such as SiO$_2$, MgF$_2$, or the like) on a surface of a light transmitting member formed in a rectangular shape using a light transmitting material (for example, silicon, glass, or the like).

The bonding member 85 includes a first portion 85a arranged over the entire region of the light incident surface 84a of the band pass filter 84. That is, the first portion 85a in the bonding member 85 is a portion arranged between the light emission surface 83b of the light transmitting member 83 and the light incident surface 84a of the band pass filter 84 facing each other. The bonding member 85 further includes a second portion 85b protruding outward from the outer edge of the band pass filter 84 when viewed in a direction parallel to the line 9. The second portion 85b reaches the inner surface 74a of the side wall 74 and is in contact with the inner surface 74a of the side wall 74. Furthermore, the second portion 85b is in contact with the side surface 84c of the band pass filter 84.

In the light detection device 10 configured as described above, when light is incident on the band pass filter 84 from outside via the opening 71a, the light transmitting member 83, and the bonding member 85, light with a predetermined wavelength range is selectively transmitted. When the light transmitted through the band pass filter 84 is incident on the light transmission region 1a of the Fabry-Perot interference filter 1, light with a predetermined wavelength out of the light with the predetermined wavelength range is selectively transmitted. The light transmitted by the light transmission region 1a of the Fabry-Perot interference filter 1 is incident on the light receiving portion of the light detector 77 and is detected by the light detector 77. That is, the light detector 77 converts the light transmitted through the Fabry-Perot interference filter 1 into an electric signal and outputs the electric signal. For example, the light detector 77 outputs an electric signal of a strength corresponding to the intensity of the light incident on the light receiving portion.

[Operation and Effect of Electrical Inspection Method]

The above-described electrical inspection method includes a step of preparing a wafer 100 including a plurality of Fabry-Perot interference filter portions 1A and a step of inspecting electrical characteristics of each of the Fabry-Perot interference filter portions 1A. This electrical inspection method inspects electrical characteristics of a plurality of Fabry-Perot interference filter portions 1A to be a plurality of Fabry-Perot interference filters 1, in a state of the wafer 100. This enables the electrical inspection method to obtain a plurality of Fabry-Perot interference filters 1 with high efficiency and with high yield. The reason is as follows. The Fabry-Perot interference filter 1 is an element in which characteristics are likely to change during individual processes from being cut out from a wafer 100 to being assembled onto a light detection device 10, for example. Therefore, inspection of the characteristics of the Fabry-Perot interference filter 1 is considered to be necessary during the final assembly. On the other hand, the present inventors have found that the Fabry-Perot interference filter portion 1A once being a non-faulty product in the state of the wafer 100 is unlikely to be a faulty Fabry-Perot interference filter 1 even with a subsequent change in characteristics. Therefore, by inspecting the electrical characteristics of each of Fabry-Perot interference filter portions 1A in the state of wafer 100, it is possible to increase the probability of bringing a non-faulty Fabry-Perot interference filter 1 to the final assembly stage while eliminating the waste that the Fabry-Perot interference filter 1 that is faulty in the state of wafer 100 is brought to the final assembly stage.

In addition, this electrical inspection method enables inspection of the electrical characteristics of each of Fabry-Perot interference filter portions 1A with high efficiency and high accuracy. The reason is as follows. For example, in order to inspect the electrical characteristics of each of Fabry-Perot interference filters 1, it would be necessary to adjust a support angle for each of the Fabry-Perot interference filters 1 to reliably bring a pair of probe needles 543 into contact with a pair of terminals 15 and 16 of the Fabry-Perot interference filter 1. By inspecting the electrical characteristics of each of Fabry-Perot interference filter portions 1A in the state of the wafer 100, the burden of such adjustment can be reduced. Furthermore, the electrical characteristics in the Fabry-Perot interference filter 1 changes depending on environmental conditions such as temperature. Therefore, when the electrical characteristics are inspected for each of the Fabry-Perot interference filters 1, the environmental conditions being the basis of inspection results are likely to vary between the individual Fabry-Perot interference filters 1. By inspecting the electrical characteristics of each of Fabry-Perot interference filter portions 1A in the state of the wafer 100, inspection results can be obtained under stable environmental conditions.

In the step of inspecting the electrical characteristics in the above-described electrical inspection method, the capacitance is measured between the pair of terminals 15 and 16 provided in each of the Fabry-Perot interference filter portions 1A. This makes it possible to inspect the presence or absence of breakage in the second mirror portion 32 or the presence or absence of disconnection in the wiring 12a, 13a, or 14a, or the like, for each of the Fabry-Perot interference filter portions 1A.

In the step of inspecting the electrical characteristics in the above-described electrical inspection method, the leakage current is measured by application of a voltage between the pair of terminals 15 and 16 provided in each of the Fabry-Perot interference filter portions 1A. This makes it possible to inspect the presence or absence of a foreign substance in the gap S or the presence or absence of disconnection in the wiring 12a, 13a, or 14a, or the like, for each of the Fabry-Perot interference filter portions 1A.

The above-described electrical inspection method further includes a step of imaging the wafer 100. This makes it possible to acquire coordinate information of each of the Fabry-Perot interference filter portions 1A and possible to bring a pair of probe needles 543 into contact with a pair of terminals 15 and 16 of the Fabry-Perot interference filter portions 1A on the basis of the acquired coordinate information.

The wafer 100 includes a plurality of Fabry-Perot interference filter portions 1A in which the distance between the first mirror portion 31 and the second mirror portion 32 facing each other changes by the electrostatic force. Accordingly, it is also possible to inspect the light transmission characteristics (such as the transmittance of light transmitted through the first mirror portion 31 and the second mirror portion 32 facing each other) for each of the Fabry-Perot interference filter portions 1A. However, such an optical inspection method is expected to take a longer time than the electrical inspection method described above. Therefore, in the case of implementing the optical inspection method for each of the Fabry-Perot interference filter portions 1A, obtaining knowledge about faulty products by implementing an electrical inspection on each of the Fabry-Perot interference filter portions 1A before conducting the optical inspection would make it possible to exclude the waste of implementing the optical inspection method on a faulty Fabry-Perot interference filter portion 1A.

In the wafer 100, the plurality of Fabry-Perot interference filter portions 1A to be the plurality of Fabry-Perot interference filters 1 is provided in the effective area 101. In addition, the plurality of dummy filter portions 2A is provided in the dummy area 102 provided along the outer edge 110c of the substrate layer 110 to surround the effective area 101, and the intermediate layer 23 is provided between the first mirror portion 31 and the second mirror portion 32 facing each other in each of the dummy filter portions 2A. This configuration sufficiently ensures the strength of the entire wafer 100. This facilitates handling of the wafer 100 when the above-described electrical inspection method is implemented on each of Fabry-Perot interference filter portions 1A. Further, since warpage of the wafer 100 can be suppressed, the pair of probe needles 543 can be reliably brought into contact with the pair of terminals 15 and 16 of each of the Fabry-Perot interference filter portions 1A.

Moreover, according to the method of manufacturing the wafer 100, the gap S is formed in each of the Fabry-Perot interference filter portions 1A while the plurality of Fabry-Perot interference filter portions 1A is still in the state of the wafer 100. Accordingly, compared to a case of forming the gap S individually at a chip level, it is possible to form the gap S between the first mirror portion 31 and the second mirror portion 32 with significantly higher efficiency. Furthermore, since a process proceeds simultaneously in the effective area 101 at a portion corresponding to an arbitrary substrate 11 within the substrate layer 110 and portions corresponding to the surrounding substrates around the substrate 11, such as in the etching of the intermediate layer 230 simultaneously performed onto the plurality of two-dimensionally arranged portions 50 expected to be removed, it is possible to reduce an unevenness of in-plane stress in the substrate layer 110. Therefore, according to the method of manufacturing the wafer 100, it is possible to obtain the wafer 100 capable of performing stable mass-production of high-quality Fabry-Perot interference filters 1.

Furthermore, irradiation of the laser light L to form the modified region 7 inside the substrate layer 110 along each of the lines 5 and thereby cutting the wafer 100 along each of the lines 5 will be extremely effective in manufacturing the Fabry-Perot interference filter 1 for the following reasons. That is, cutting the wafer 100 using the laser light L needs no water and thus can suppress an incidence of damage onto the second mirror portion 32 floating on the gap S by water pressure and suppress sticking (phenomenon of stoppage of the second mirror portion 32 due to contact with the first mirror portion 31) caused by water intrusion into the gap S. Therefore, cutting the wafer 100 using the laser light L is extremely effective in manufacturing the Fabry-Perot interference filter 1.

Modifications

Although an embodiment of the present disclosure has been described as above, the present disclosure is not limited to the embodiment described above. For example, the material and the shape of each configuration are not limited to the materials and the shapes described above, and it is possible to employ various materials and shapes. In the wafer 100, when viewed in the thickness direction of the substrate layer 110, the outer shape of the Fabry-Perot interference filter portion 1A and the outer shape of the dummy filter portion 2A need not be the same. Furthermore, when cutting out a plurality of Fabry-Perot interference filters 1 from the wafer 100, there is no need to cut out all the dummy filter portions 2A (that is, it is not necessary to singulate all the dummy filter portions 2A). Furthermore, the configuration of the dummy area 102 is not limited to the above. For example, in a region corresponding to the dummy area 102, at least the second mirror portion 32 need not be surrounded by the first groove 290 that is annularly continuous (for example, the first groove 290 may simply cross a region corresponding to the dummy area 102), or the first groove 290 need not be formed in the device layer 200. Furthermore, in a region corresponding to the dummy area 102, a portion of the device layer 200 or the entire device layer 200 need not be provided. That is, the dummy area is not an essential configuration in the wafer as an inspection target of the present disclosure. Furthermore, in the above embodiment, the electrostatic capacitance generated between the first electrode 12 and the third electrode 14 is measured in the Fabry-Perot interference filter portion 1A. Alternatively, another electrode, separately from the first electrode 12 and the third electrode 14, for measuring the capacitance may be provided in each of the first mirror portion 31 and the second mirror portion 32 so as to measure the electrostatic capacitance generated between the electrodes.

Furthermore, as illustrated in FIG. 16, the wafer 100 may include the modified region 7 formed inside the substrate layer 110 so as to correspond to the first groove 290. Here, forming the modified region 7 so as to correspond to the first groove 290 means that the modified region 7 is formed to overlap the first groove 290 when viewed in the facing direction, and in particular, means the modified region 7 is formed along each of the lines 5. This enables the fracture to be extended from the modified region 7 in a thickness direction of the substrate layer 110, making it possible to easily and accurately cut out a plurality of Fabry-Perot interference filters 1 from the wafer 100. In this case, the expanding tape 60 may be attached to the second surface 110b side of the substrate layer 110. At this time, the outer edge portion of the expanding tape 60 attached to the wafer 100 is held by an annular frame. This facilitates handling of the wafer 100 even in a state where the modified region 7 is formed inside the substrate layer 110. In the wafer 100 in which the modified region 7 is formed inside the substrate layer 110, there is a possibility that a fracture would unexpectedly extend from the modified region 7. In the wafer 100, the plurality of dummy filter portions 2A, the first groove 290, and the second groove 470 are not provided in the pair of areas 102a of the dummy area 102. This can suppress the occurrence of a fracture and even when a fracture develops, the extension of the fracture would be stopped by the pair of areas 102a.

Figure 19:
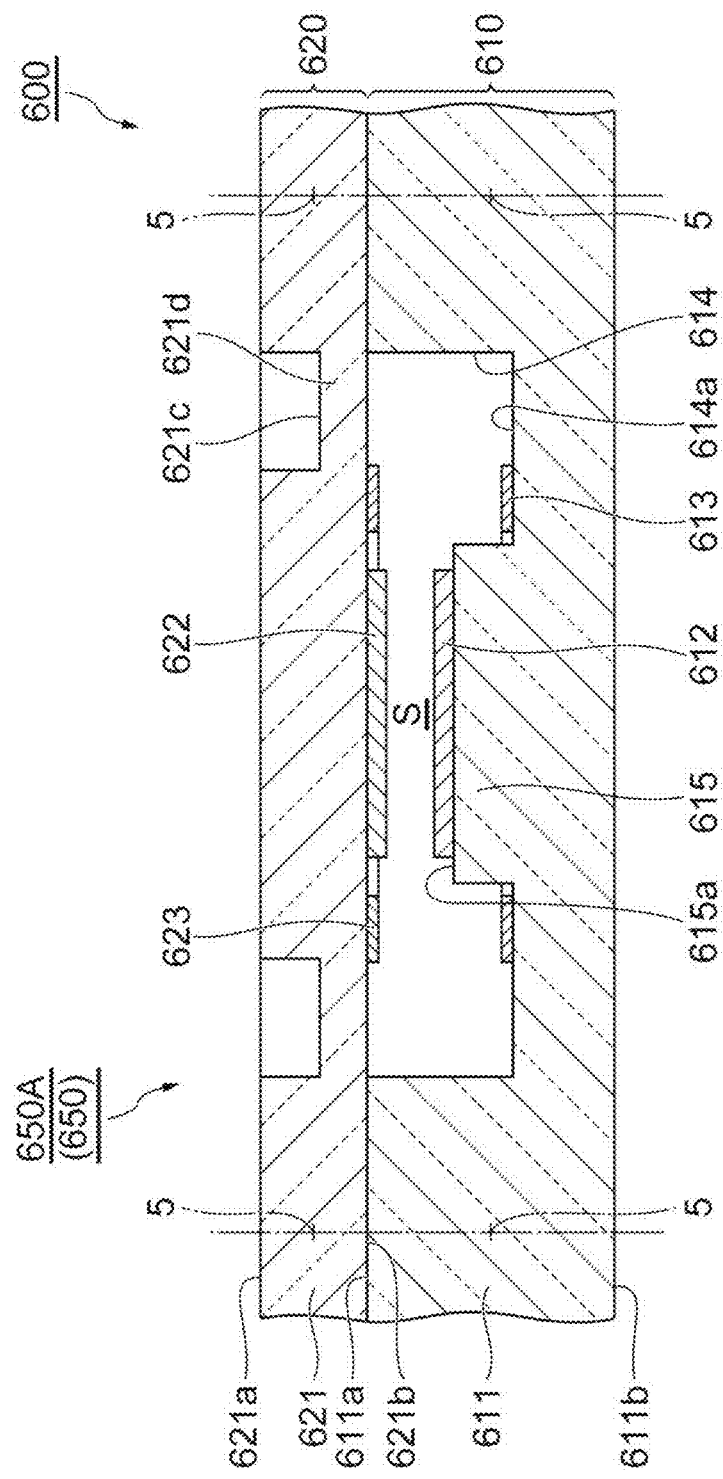
FIG. 19 is a cross-sectional view of a wafer according to a modification.

Furthermore, as illustrated in FIG. 19, a wafer 600 formed by bonding a first wafer 610 and a second wafer 620 may be defined as the inspection target. The wafer 600 includes a plurality of Fabry-Perot interference filter portions 650A. Each of the plurality of Fabry-Perot interference filter portions 650A is to be each of a plurality of Fabry-Perot interference filters 650 when the wafer 600 is cut along each of lines 5 set on each of the first wafer 610 and the second wafer 620. The plurality of Fabry-Perot interference filter portions 650A is two-dimensionally arranged when viewed in the thickness direction of the wafer 600.

The first wafer 610 includes a substrate layer 611, a plurality of first mirror portions 612, and a plurality of drive electrodes 613. The substrate layer 611 includes a surface 611a and a surface 611b opposite to the surface 611a. The substrate layer 611 is formed of a light transmitting material. Each of the first mirror portions 612 is a metal film, a dielectric multilayer film, or a composite film thereof, for example. The drive electrode 613 is formed of a metal material, for example.

The second wafer 620 includes a substrate layer 621, a plurality of second mirror portions 622, and a plurality of drive electrodes 623. The substrate layer 621 includes a surface 621a and a surface 621b opposite to the surface 621a. The substrate layer 621 is formed of a light transmitting material. Each of the second mirror portions 622 is a metal film, a dielectric multilayer film, or a composite film thereof, for example. The drive electrode 623 is formed of a metal material, for example.

In the wafer 600, one Fabry-Perot interference filter portion 650A includes one first mirror portion 612, one drive electrode 613, one second mirror portion 622, and one drive electrode 623. Hereinafter, the configuration of the wafer 600 will be described focusing on the one Fabry-Perot interference filter portion 650A.

A recess 614 is formed on the surface 611a of the substrate layer 611. A protrusion 615 is provided on a bottom surface 614a of the recess 614. The height of the protrusion 615 is less than the depth of the recess 614. That is, an end surface 615a of the protrusion 615 is at a recessed level with respect to the surface 611a of the substrate layer 611. The first mirror portion 612 is provided on the end surface 615a of the protrusion 615. The drive electrode 613 is provided on the bottom surface 614a of the recess 614 so as to surround the protrusion 615, The drive electrode 613 is electrically connected to an electrode pad (not illustrated) via wiring (not illustrated) provided on the substrate layer 611, for example. The electrode pad is provided in a region of the substrate layer 611 that can be accessed from the outside, for example.

The surface 621b of the substrate layer 621 is joined to the surface 611a of the substrate layer 611 by a plasma polymerized film, for example. On the surface 621b of the substrate layer 621, the second mirror portion 622 and the drive electrode 623 are provided. The second mirror portion 622 faces the first mirror portion 612 via the gap S. The drive electrode 623 is provided on the surface 621b of the substrate layer 621 so as to surround the second mirror portion 622 and faces the drive electrode 613 via the gap S. The drive electrode 623 is electrically connected to an electrode pad (not illustrated), for example, via wiring (not illustrated) provided on the substrate layer 621. The electrode pad is provided in a region of the substrate layer 621 that can be accessed from the outside, for example.

A groove 621c is formed on the surface 621a of the substrate layer 621 so as to surround the second mirror portion 622 and the drive electrode 623 when viewed in the thickness direction of the wafer 600. The groove 621c extends in an annular shape. The portion of the substrate layer 621 surrounded by the groove 621c is displaceable in the thickness direction of the wafer 600 with the portion where the groove 621c is formed defined as a diaphragm-like holder 621d. In the diaphragm-like holder 621d, it is allowable to form a groove surrounding the second mirror portion 622 and the drive electrode 623 when viewed in the thickness direction of the wafer 600 on at least one of the surface 621a and the surface 621b of the substrate layer 621. Furthermore, it is also allowable to form the groove surrounding the first mirror portion 612 and the drive electrode 613 in the substrate layer 611 when viewed in the thickness direction of the wafer 600 so as to form the diaphragm-like holder in the substrate layer 611. Further alternatively, instead of the diaphragm-like holder, a holder may be formed by a plurality of beams arranged radially.

In the wafer 600 on which each of the Fabry-Perot interference filter portions 650A is formed as described above, when a voltage is applied between the drive electrode 613 and the drive electrode 623 in each of the Fabry-Perot interference filter portions 650A, an electrostatic force corresponding to the voltage is generated between the drive electrode 613 and the drive electrode 623. The portion of the substrate layer 621 surrounded by the groove 621c is attracted toward the substrate layer 611 side by the electrostatic force, thereby adjusting the distance between the first mirror portion 612 and the second mirror portion 622. This allows transmission of light having a wavelength corresponding to the distance between the first mirror portion 612 and the second mirror portion 622. The wafer (100, 600) as an inspection target in the present disclosure may include the substrate layer (110, 611) and the plurality of pairs two-dimensionally arranged on the substrate layer (110, 611), each of the plurality of pairs having a first mirror portion (31, 612) and a second mirror portion (32, 622) and may include the plurality of Fabry-Perot interference filter portions (1A, 650A), each of the plurality of Fabry-Perot interference filter portions (1A, 650A) in which the gap S is formed between the first mirror portion (31, 612) and the second mirror portion (32, 622) facing each other, whereby the distance between the first mirror portion (31, 612) and the second mirror portions (32, 622) facing each other changes by the electrostatic force.

REFERENCE SIGNS LIST 1A, 650A: Fabry-Perot interference filter portion, 15, 16: terminal, 31, 612: first mirror portion, 32, 622: second mirror portion, 100, 600: wafer, 110, 611: substrate layer, 110a: first surface, 110b: second surface, 220: first mirror layer, 240: second mirror layer, S: gap.

The invention claimed is:
1. An electrical inspection method comprising:
a step of preparing a wafer including a substrate layer and a plurality of pairs two-dimensionally arranged on the substrate layer, each of the plurality of pairs having a first mirror portion and a second mirror portion, a plurality of Fabry-Perot interference filter portions being formed in the wafer, each of the plurality of Fabry-Perot interference filter portions in which a gap is formed between the first mirror portion and the second mirror portion facing each other and a distance between the first mirror portion and the second mirror portion facing each other varies by an electrostatic force; and
a step of inspecting electrical characteristics of each of the plurality of Fabry-Perot interference filter portions before the wafer is cut,
wherein each of the plurality of Fabry-Perot interference filter portions is configured to be a respective Fabry-Perot interference filter after the wafer is cut,
each of the plurality of Fabry-Perot interference filter portions includes a pair of electrodes to generate the electrostatic force, a pair of terminals, and a plurality of wirings, each of the terminals is electrically connected to each of the electrodes through respective wirings, and each of the plurality of Fabry-Perot interference filter portions is surrounded by a region in which no wiring is formed.

2. The electrical inspection method according to claim 1, wherein in the step of inspecting the electrical characteristics, capacitance is measured between a pair of terminals provided in each of the plurality of Fabry-Perot interference filter portions to generate an electrostatic force.

3. The electrical inspection method according to claim 1, wherein in the step of inspecting the electrical characteristics, leakage current is measured by applying voltage between a pair of terminals provided in each of the plurality of Fabry-Perot interference filter portions to generate an electrostatic force.

4. The electrical inspection method according to claim 1, further comprising a step of imaging the wafer.

* * * * *